US010084015B2

(12) United States Patent
Wicklein

(10) Patent No.: US 10,084,015 B2
(45) Date of Patent: Sep. 25, 2018

(54) RESISTIVE MEMORY ELEMENT EMPLOYING ELECTRON DENSITY MODULATION AND STRUCTURAL RELAXATION

(71) Applicant: SANDISK TECHNOLOGIES LLC, Plano, TX (US)

(72) Inventor: Sebastian Wicklein, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/581,078

(22) Filed: Apr. 28, 2017

(65) Prior Publication Data

US 2017/0317140 A1    Nov. 2, 2017

Related U.S. Application Data

(60) Provisional application No. 62/328,746, filed on Apr. 28, 2016.

(51) Int. Cl.
| | | |
|---|---|---|
| *H01L 27/24* | (2006.01) | |
| *H01L 45/00* | (2006.01) | |
| *G11C 13/00* | (2006.01) | |

(52) U.S. Cl.
CPC ...... *H01L 27/2454* (2013.01); *G11C 13/0007* (2013.01); *G11C 13/0069* (2013.01); *G11C 13/0097* (2013.01); *H01L 45/1253* (2013.01); *H01L 45/146* (2013.01); *H01L 45/16* (2013.01); *H01L 45/1616* (2013.01)

(58) Field of Classification Search
CPC ............ G11C 11/1675; G11C 13/0069
USPC ................................... 365/148, 158
See application file for complete search history.

(56) References Cited

U.S. PATENT DOCUMENTS

| | | | | |
|---|---|---|---|---|
| 3,757,174 A | * | 9/1973 | Shigemasa | H01L 33/00 257/102 |
| 5,079,473 A | * | 1/1992 | Waymouth | H01J 61/02 313/112 |
| 5,910,905 A | * | 6/1999 | Qian | G06F 17/10 708/311 |
| 5,915,167 A | | 6/1999 | Leedy | |

(Continued)

FOREIGN PATENT DOCUMENTS

WO    WO2007004843 A1    1/2007

OTHER PUBLICATIONS

Kerrien et al., Gas immersion laser doping [GILD] for ultra-shallow junction formation, 2004, Elsevier, 453-454 (2004) 106-109.*

(Continued)

*Primary Examiner* — Michael Tran
(74) *Attorney, Agent, or Firm* — The Marbury Law Group PLLC

(57) ABSTRACT

A memory device includes at least one memory cell which contains a resistive memory element having a conductive metal oxide located between a first electrode and a second electrode. The conductive metal oxide has a concentration of free electrons in thermodynamic equilibrium in a range from $1.0 \times 10^{20}/\text{cm}^3$ to $1.0 \times 10^{21}/\text{cm}^3$. A method of operating the memory device includes redistributing electron density to set and reset the device. An oxide barrier layer may be located between the conductive metal oxide and the second electrode.

20 Claims, 30 Drawing Sheets

(56) References Cited

U.S. PATENT DOCUMENTS

| | | | | |
|---|---|---|---|---|
| 6,552,883 B1* | 4/2003 | Grigorov | ............... | H01B 1/12 |
| | | | | 257/E23.114 |
| 6,803,576 B2* | 10/2004 | Pretto | ............... | G01N 21/3563 |
| | | | | 250/339.01 |
| 6,804,105 B2* | 10/2004 | Grigorov | ............... | H01B 1/12 |
| | | | | 257/E23.114 |
| 7,800,934 B2 | 9/2010 | Kumar et al. | | |
| 7,807,917 B2* | 10/2010 | Atanackovic | ............... | H01L 35/22 |
| | | | | 136/205 |
| 8,129,704 B2* | 3/2012 | Phatak | ............... | H01L 29/8615 |
| | | | | 257/2 |
| 8,395,926 B2* | 3/2013 | Kreupl | ............... | G11C 11/16 |
| | | | | 365/148 |
| 8,520,425 B2* | 8/2013 | Xiao | ............... | G11C 13/0007 |
| | | | | 365/148 |
| 8,667,091 B2* | 3/2014 | Almadi | ............... | H04L 41/069 |
| | | | | 709/219 |
| 8,681,530 B2* | 3/2014 | Wang | ............... | G11C 13/0007 |
| | | | | 257/2 |
| 8,735,858 B2* | 5/2014 | Strukov | ............... | H01L 45/08 |
| | | | | 257/2 |
| 9,026,413 B2* | 5/2015 | Xu | ............... | G06F 17/5009 |
| | | | | 374/142 |
| 9,269,425 B2* | 2/2016 | Lan | ............... | G11C 13/0007 |
| 9,343,507 B2 | 5/2016 | Takaki | | |
| 9,449,985 B1* | 9/2016 | Rabkin | ............... | H01L 21/28282 |
| 9,455,185 B1* | 9/2016 | Gluschenkov | .... | H01L 21/76894 |
| 9,511,240 B2* | 12/2016 | Dobrynin | ............... | A61N 1/0468 |
| 9,647,223 B2* | 5/2017 | Al-Ghamdi | ......... | H01L 51/4233 |
| 9,722,179 B2* | 8/2017 | Paz de Araujo | .... | H01L 45/1608 |
| 9,754,665 B2* | 9/2017 | Chen | ............... | G11C 13/0007 |
| 9,755,146 B2* | 9/2017 | Shifren | ............... | H01L 49/003 |
| 9,806,256 B1* | 10/2017 | Wu | ............... | H01L 45/124 |
| 2008/0259981 A1* | 10/2008 | Wang | ............... | B82Y 20/00 |
| | | | | 372/44.01 |
| 2011/0135848 A1* | 6/2011 | Edwards | ............... | C23C 14/086 |
| | | | | 428/1.1 |
| 2012/0113706 A1* | 5/2012 | Williams | ............ | G11C 13/0007 |
| | | | | 365/148 |
| 2013/0043455 A1 | 2/2013 | Bateman | | |
| 2013/0221314 A1* | 8/2013 | Pramanik | ............... | H01L 45/08 |
| | | | | 257/4 |
| 2016/0247830 A1* | 8/2016 | Zhang | ............... | H01L 27/1225 |
| 2017/0309324 A1* | 10/2017 | Kumar | ............... | G11C 11/4091 |
| 2018/0059440 A1* | 3/2018 | Yu | ............... | G02F 1/0018 |

OTHER PUBLICATIONS

Chen, Y. et al., "Vacancy-Modulated Conductive Oxide Resistive Ram Device Including an Interfacial Oxygen Source Layer," U.S. Appl. No. 15/228,216, filed Aug. 4, 2016.

* cited by examiner

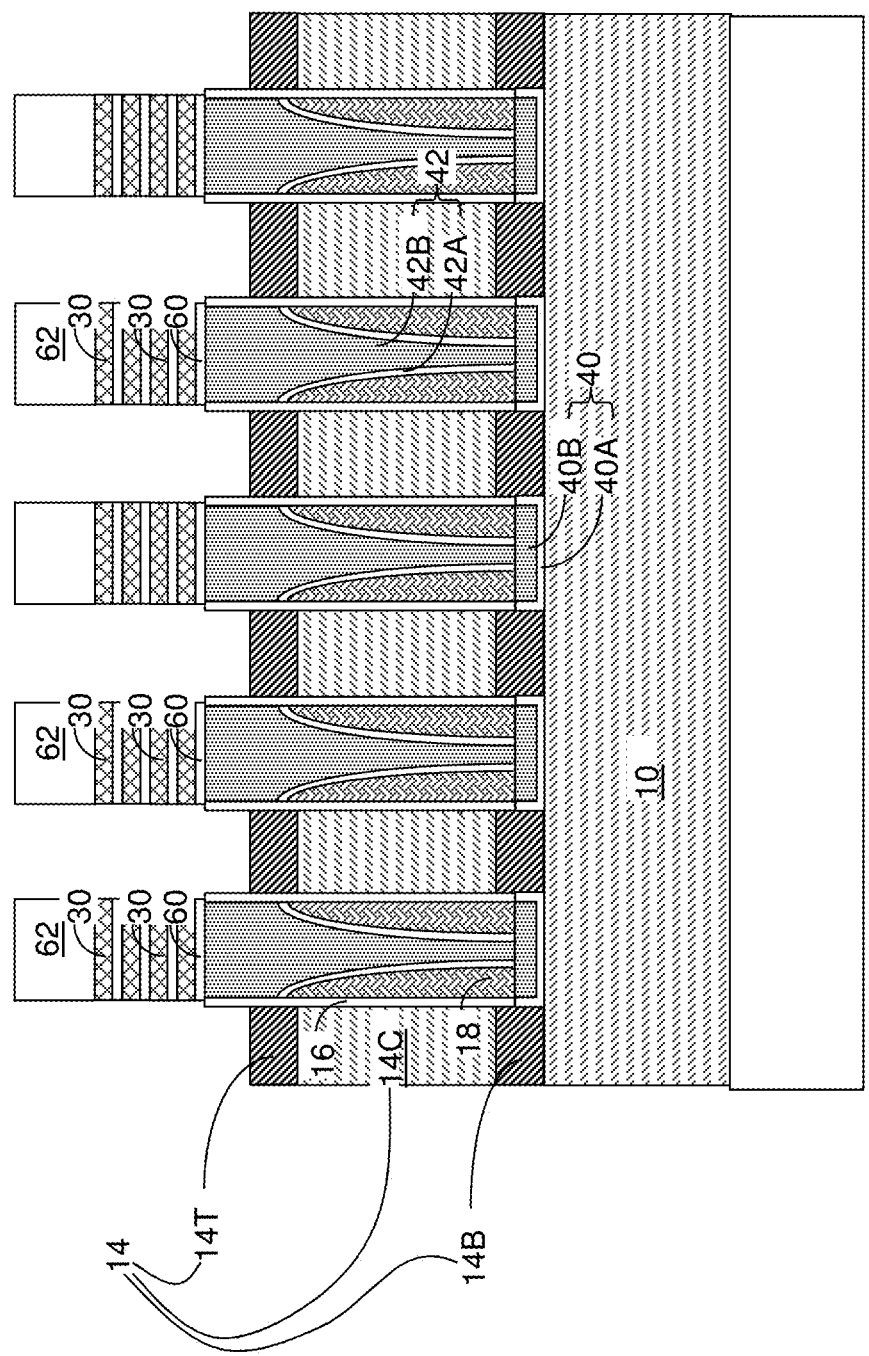

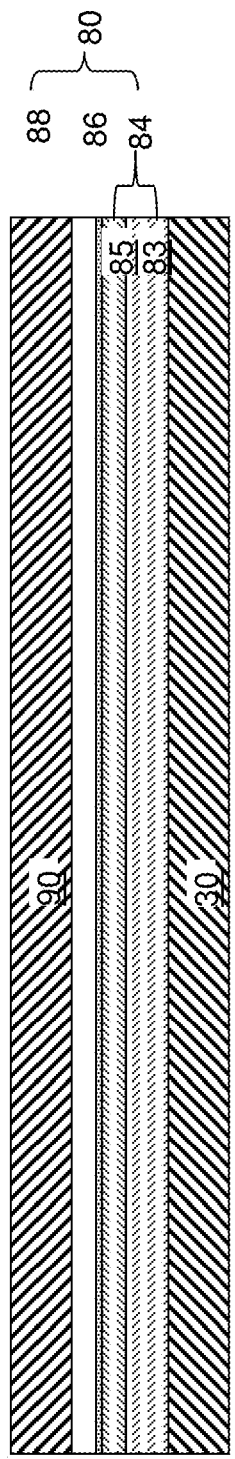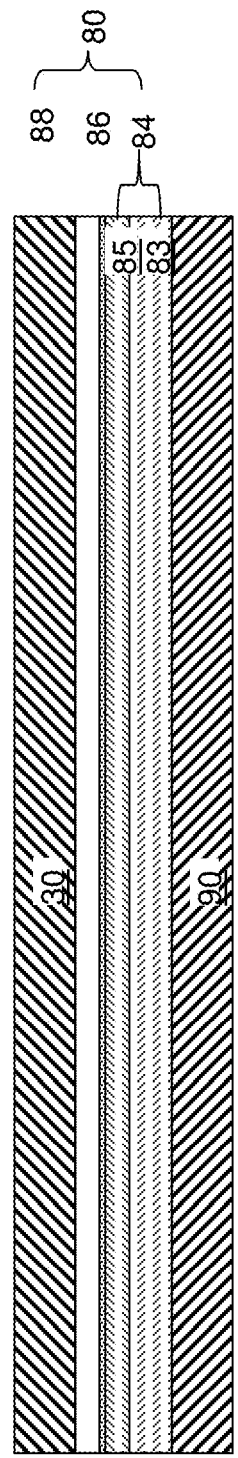
FIG. 6A
FIG. 6B

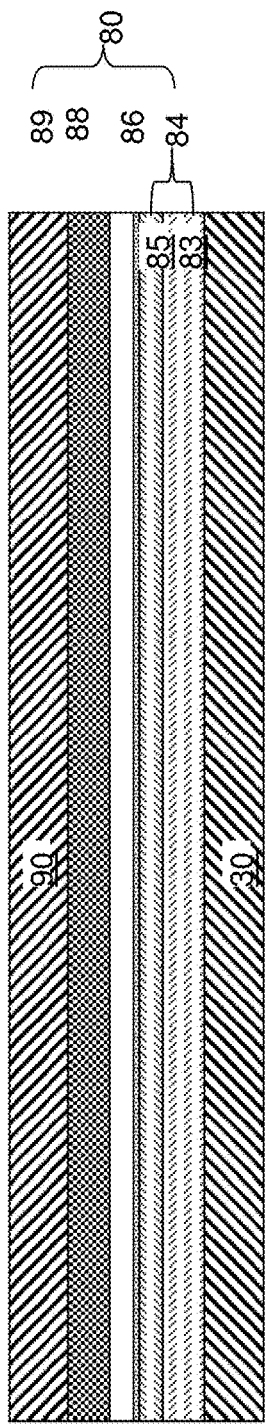
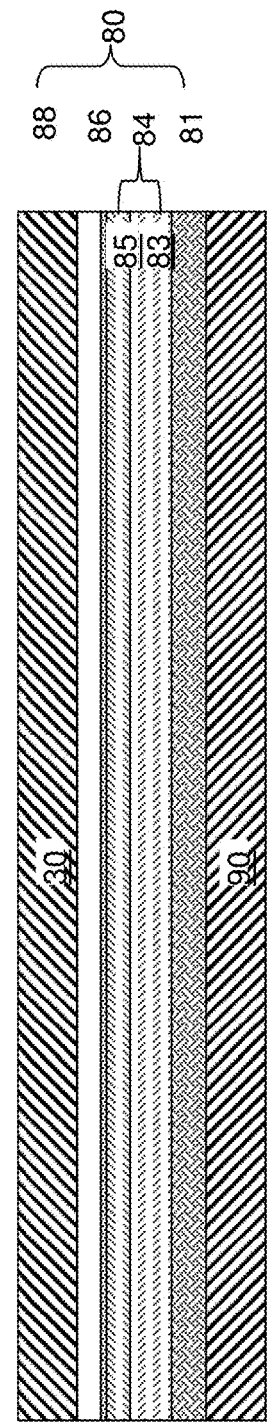
FIG. 6C
FIG. 6D

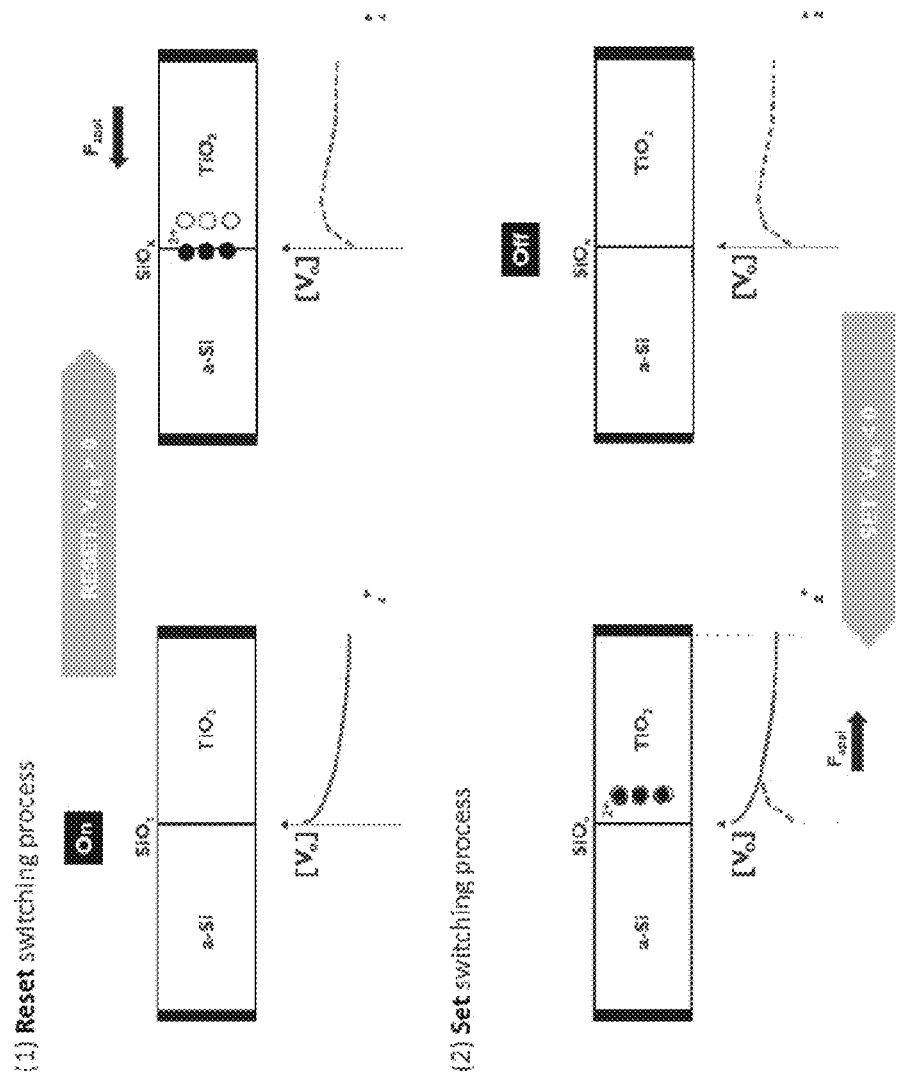

RESISTIVE MEMORY ELEMENT EMPLOYING ELECTRON DENSITY MODULATION AND STRUCTURAL RELAXATION

FIELD

The present disclosure relates generally to the field of semiconductor devices and specifically to three-dimensional non-volatile memory devices, such as a three-dimensional resistive random access memory (ReRAM) devices and other three-dimensional devices, and methods of making the same.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a memory device including at least one memory cell is provided. Each of the at least one memory cell contains resistive memory element comprising a conductive metal oxide located between a first electrode and a second electrode. The conductive metal oxide has a concentration of free electrons in thermodynamic equilibrium in a range from $1.0 \times 10^{20}/cm^3$ to $1.0 \times 10^{21}/cm^3$. A method of operating the memory device includes redistributing electron density to set and reset the device.

BRIEF DESCRIPTION OF THE DRAWINGS

FIG. 2A is a vertical cross-sectional view of the exemplary structure after formation of alternating stacks of insulating layers and conductive material layers according to an embodiment of the present disclosure.

FIG. 6A is a cross-sectional view of a portion of a first exemplary layer stack including memory elements of the present disclosure according to an embodiment of the present disclosure.

FIG. 6B is a cross-sectional view of a portion of a second exemplary layer stack including memory elements of the present disclosure according to an embodiment of the present disclosure.

FIG. 6C is a cross-sectional view of a portion of a third exemplary layer stack including memory elements of the present disclosure according to an embodiment of the present disclosure.

FIG. 6D is a cross-sectional view of a portion of a fourth exemplary layer stack including memory elements of the present disclosure according to an embodiment of the present disclosure.

FIG. 15A is diagram illustrating operation of a prior art BMC ReRAM during a reset switching process.

FIG. 15B is a diagram illustrating operation of a prior BMC ReRAM during a set switching process.

DETAILED DESCRIPTION

Figure 1A:
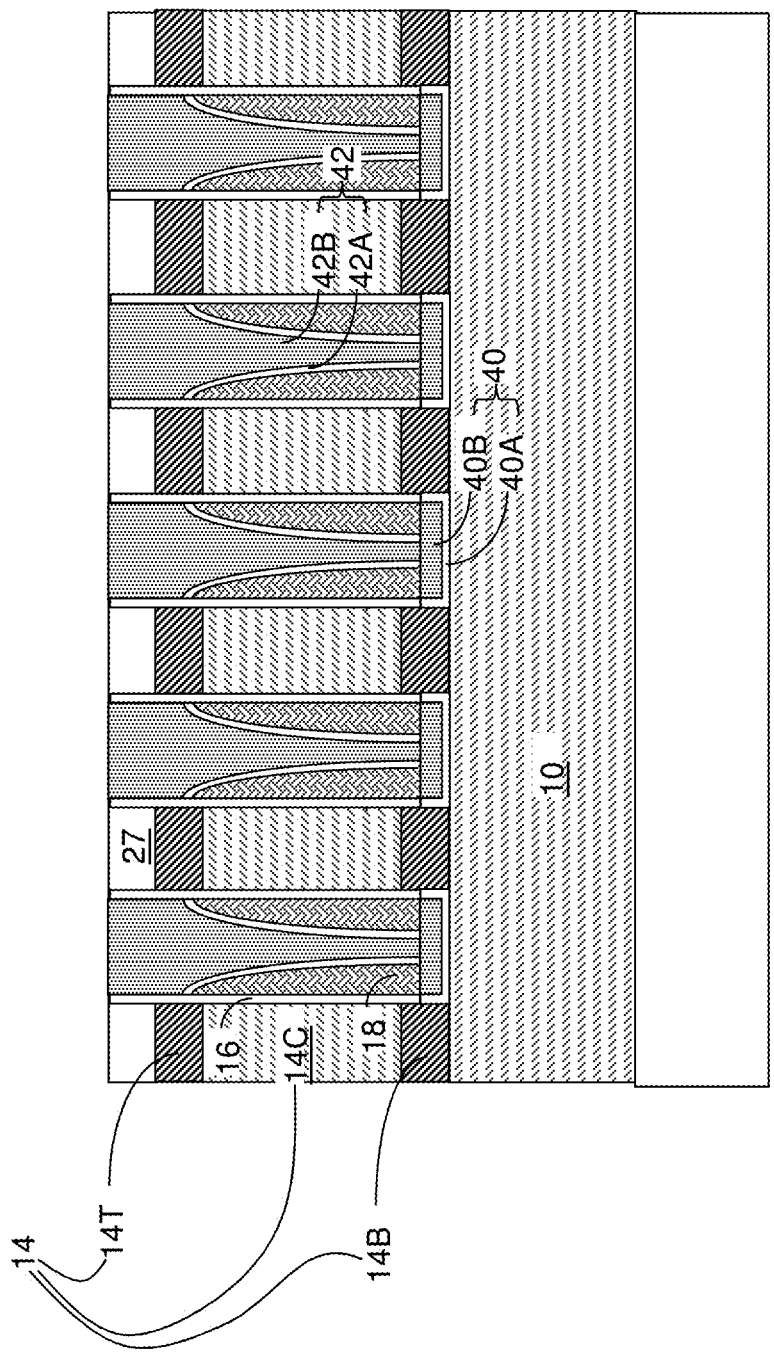
FIG. 1A is a vertical cross-sectional view of an exemplary structure after formation of bit line access transistors and dielectric fill layers according to an embodiment of the present disclosure.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A barrier modulated cell (BMC) is a memory cell in which the resistance is modulated by modulation of energy band structure within the cell. When the charge carrier density is modulated, the resistance of the cell is changed. An operation that changes the resistance of the memory cell to a high resistance state is herein referred to as a "resetting" operation. An operation that changes the resistance of the memory cell to a low resistance state is herein referred to as a "setting" operation. A barrier modulated cell (BMC) resistive random access memory (ReRAM) device is a ReRAM device in which the resistance of a memory element is modulated by changes in the band structure and consequent changes in the charge distribution.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Figure 1B:
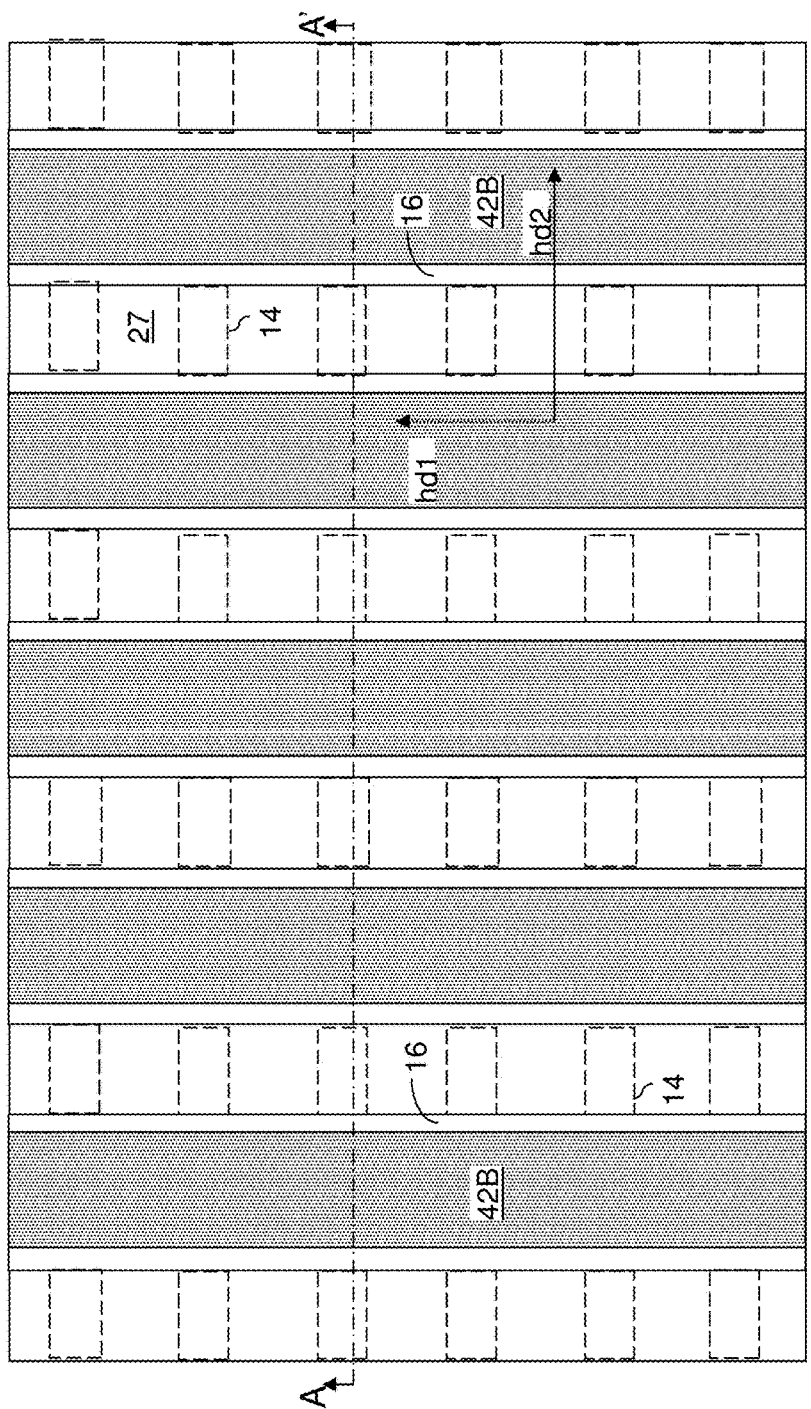
FIG. 1B is a see-through top-down view of the exemplary structure of FIG. 1A. The vertical plane A-A' is the plane of the cross-section for FIG. 1A.

Referring to FIGS. 1A and 1B, an exemplary structure is illustrated, which can be an in-process ReRAM device. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. A "semiconducting material" refers to a material having electrical conductivity in a range from $1.0\times10^{-6}$ S/cm to $1.0\times10^{5}$ S/cm. All measurements for electrical conductivities are made at the standard condition.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions (not shown). A one-dimensional array of the global bit lines 10 and the separator dielectric material portions can extend along the second horizontal direction hd2. Alternatively, the one-dimensional array of the global bit lines 10 and the separator dielectric material portions may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

The access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

A semiconductor layer stack (14T, 14C, 14B) is formed over the top surfaces of the global bit lines 10 and the separator dielectric material portions. The semiconductor layer stack includes a first conductivity type semiconductor layer, a channel material layer including a semiconductor material, and a second conductivity type semiconductor layer having a same type of doping as the first conductivity type semiconductor layer. Subsequently, an optional sacrificial matrix layer 27 (e.g., a sacrificial cap) can be formed on the top surface of the semiconductor layer stack. The sacrificial matrix layer can include, for example, organosilicate glass, a semiconductor material, or other sacrificial material that can be subsequently removed selective to the second conductivity type semiconductor layer.

The sacrificial matrix layer and the semiconductor layer stack are subsequently patterned into a one-dimensional array of rail structures extending along the first horizontal direction hd1. The rail structures include patterned remaining portions of the sacrificial matrix layer and the semiconductor layer stack, and are laterally spaced apart by trenches that extend along the first horizontal direction hd1. The first horizontal direction hd1 can be perpendicular to the second horizontal direction hd2 along which the global bit lines 10 extend.

A spacer dielectric portion 40 can be formed at the bottom of each trench. Each spacer dielectric portion 40 can be formed over of the global bit lines 10 and the separator dielectric material portions such that the top surface of the spacer dielectric portion 40 is located at a target height for placing a bottom edge of gate electrodes 18 to be subsequently formed. For example, the top surface of the spacer dielectric portion 40 can be at a level about the interface between the remaining portions of the first conductivity type semiconductor layer and the channel material layer. In one embodiment, each spacer dielectric portions 40 can include a vertical stack of a first spacer dielectric portion 40A and a second spacer dielectric portion 40B. The first spacer dielectric portion 40A can be deposited by a conformal deposition method, and the second spacer dielectric portion 40B can be deposited by a self-planarizing deposition method (such as spin coating). Portions of the first spacer dielectric portion 40A that protrudes above the top surface of the second spacer dielectric portion 40B can be removed, for example, by a selective etch that removes the material of the first spacer dielectric portion 40A selective to the material of the second spacer dielectric portion 40B. In one embodiment, the first spacer dielectric portion 40A can include silicon nitride, the second spacer dielectric portion 40B can include silicon oxide, and the selective etch can be a wet etch process that employs hot phosphoric acid.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include remaining portions of the semiconductor layer stack and the sacrificial matrix layer) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the rail structures that include the remaining portions of the semiconductor layer stack and the sacrificial matrix layer. Each dielectric rail structure 42 can have a tapered bottom portion in which the width of the dielectric rail structure 42 monotonically or strictly increases as a function of a vertical distance from the substrate 6. In one embodiment, each dielectric rail structure 42 can include a dielectric liner 42A and a dielectric rail fill portion 42B. In one embodiment, the dielectric liners 42A can include silicon nitride, and the dielectric rail fill portions 42B can include silicon oxide.

As seen from above, dielectric rail structures 42 and the rail structures (including remaining portions of the semiconductor layer stack (14T, 14C, 14B) and the sacrificial matrix layer 27) alternate along the second horizontal direction hd2 after formation of the dielectric rail structures 42.

Subsequently, a photoresist layer can be applied over the exemplary structure, and can be lithographically patterned to cover regions that overlie the global bit lines 10. In other words, openings are formed in areas between the areas of the global bit lines 10. In one embodiment, the photoresist layer can be patterned with the same pattern as the pattern of the one-dimensional array of the global bit lines 10 such that openings in the photoresist layer extend along the second horizontal direction hd2. Employing the combination of the photoresist layer and optionally the dielectric rail structures 42 as an etch mask, physically exposed portions of the rail structures (including remaining portions of the semiconductor layer stack and the sacrificial matrix layer) can be etched to form a two-dimensional array of pillar structures. Alternatively, the dielectric rail structures 42 are not used as a mask, and portions of the dielectric rail structures 42 that are not masked by the photoresist are etched together with the remaining portions of the semiconductor layer stack and the sacrificial matrix layer.

Each remaining portion of the sacrificial matrix layer constitutes a sacrificial material portion, and each remaining portion of the semiconductor layer stack constitutes a semiconductor pillar 14. Each pillar structure includes a vertical stack of a semiconductor pillar 14 and a sacrificial material portion 27. Each semiconductor pillar 14 includes a bottom active region 14B (which is a remaining portion of the first conductivity type semiconductor layer), a semiconductor channel 14C (which is a remaining portion of the channel material layer), and a top active region 14T (which is a remaining portion of the second conductivity type semiconductor layer).

Within each semiconductor pillar 14, one of the bottom active region 14B and the top active region 14T is a source region, and the other of the bottom active region 14B and the top active region 14T is a drain region. The cross-sectional shape of each semiconductor pillar 14 can be substantially invariant throughout the entirety of the semiconductor pillar 14. Further, each overlying sacrificial material portion 27 can have substantially the same horizontal cross-sectional shape as the horizontal cross-sectional shape of the underlying semiconductor pillar 14.

The photoresist layer can be removed, for example, by ashing. The two-dimensional array of cavities that separate the pillar structures along the first horizontal direction hd1 can be filled with a dielectric fill material, which can include, for example, silicon oxide, organosilicate glass, and/or silicon nitride. The dielectric fill material can be removed from above the top surfaces of the dielectric rail structures 42, for example, by chemical mechanical planarization. Each remaining portions of the dielectric fill material constitutes a dielectric fill material portion 37 located between the semiconductor pillars 14 in the hd1 direction.

Figure 2B:
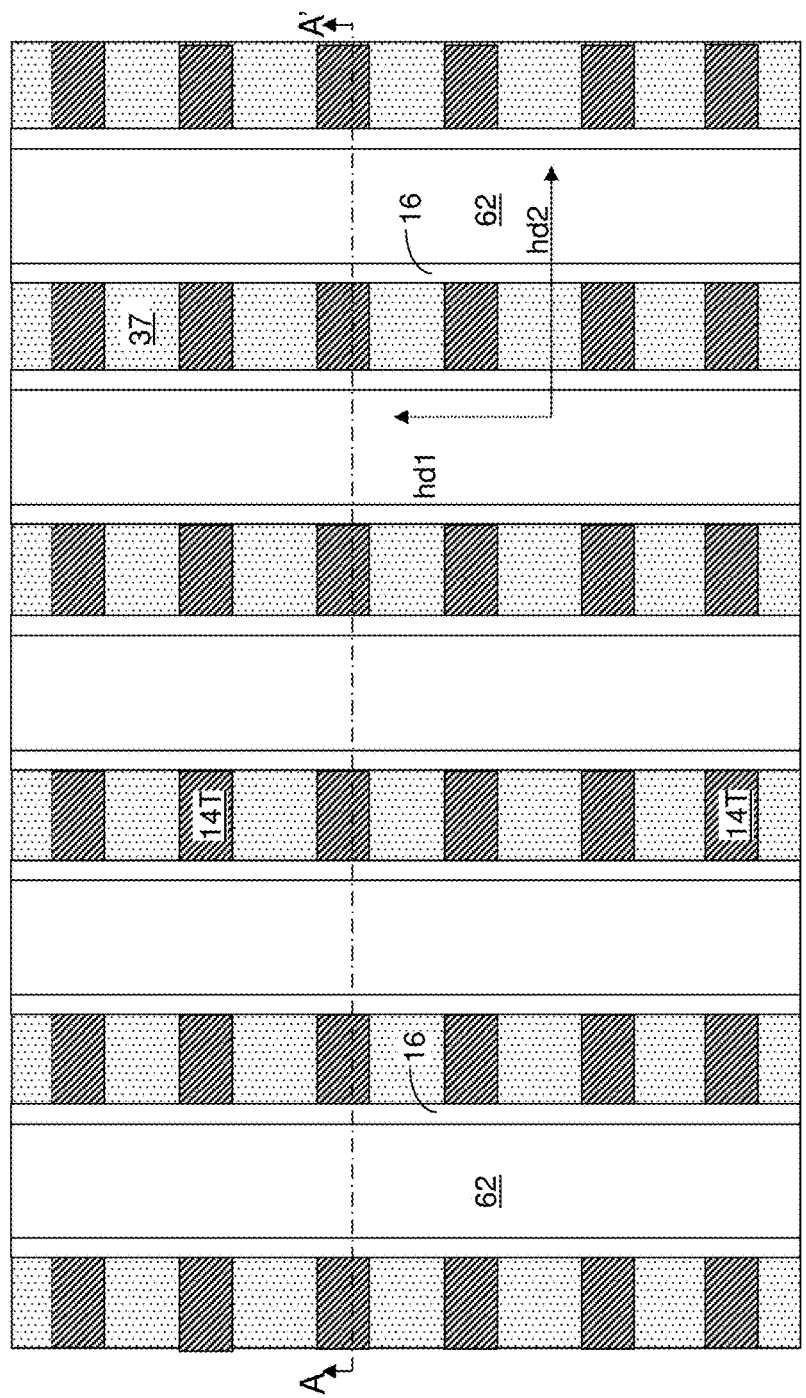
FIG. 2B is a top-down view of the exemplary structure of FIG. 2A. The vertical plane A-A' is the plane of the cross-section for FIG. 2A.

Referring to FIGS. 2A and 2B, an alternating stack of spacer material layers and insulating layers are formed over the one dimensional array of the dielectric rail structures 42 and the dielectric fill material portions as stacks of blanket (unpatterned) layers. A continuous insulating cap portion can be formed over the alternating stack of the spacer material layers and the insulating layers. In one embodiment of FIGS. 2A and 2B, the spacer material layers can be electrically conductive layers 30 that remain in a final device structure. In another embodiment, the spacer material layers can be sacrificial material layers that are subsequently replaced electrically conductive layers, as will be described in more detail below.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the continuous insulating cap portion and the alternating stack of the electrically conductive layers and the insulating layers are patterned to form line stack rail structures. Each line stack rail structure overlies a dielectric rail structure 42, extends along the first horizontal direction hd1, and is laterally spaced apart from one other line stack rail structures along the second horizontal direction hd2. Each patterned portion of the continuous insulating cap portion is herein referred to as an insulating cap portion 62. Each patterned portion of the electrically conductive layers is herein referred to as a conductive material layer 30 (e.g., word line). Each patterned portion of the insulating layer is herein referred to as an insulating layer. Thus, each line stack rail structure (30, 60, 62) includes an alternating stack of conductive material layers 30 and insulating layers 60 and an insulating cap portion 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers (i.e., the conductive material layers) 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, conductive layers 30 may comprise a metal having a work function lower than 4.5 rather instead of or in addition to a metal nitride. In another embodiment, the first electrically conductive material can include a doped semiconductor material. The insulating layers 60 and the insulating cap portion 62 may comprise any suitable insulating material, such as silicon oxide.

The thickness of the conductive material layers 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap portions 62 can be in a range from 5 nm to 300 nm, although lesser and greater thicknesses can also be employed.

A pair of a conductive material layer 30 and an insulating layer 60 can constitute a unit of repetition in the alternating stack (30, 60) of the conductive material layers 30 and the insulating layers 60. The total number of repetitions can be in a range from 8 to 1,024, although lesser and greater number of repetitions can also be employed. Thus, a plurality of alternating stacks (30, 60) of insulating layers 60 and conductive material layers 30 is formed over a substrate 6. Each of the insulating layers 60 and the conductive material layers 30 extends along the first horizontal direction (i.e., the word line direction) hd1. The alternating stacks (30, 60) are laterally spaced from one another along the second horizontal direction hd2 (i.e., the global bit line direction).

Subsequently, top regions of the sacrificial material portions 27 can be removed from above the top surfaces of the semiconductor pillars 14, for example, by an isotropic etch or an anisotropic etch. The isotropic or anisotropic etch can recess the sacrificial material portions 27 at least until the top surfaces of the semiconductor pillars 14 are physically exposed. In an illustrative example, if the sacrificial material portions 27 include organosilicate glass, a wet etch employing dilute hydrofluoric acid can be employed.

Figure 3:
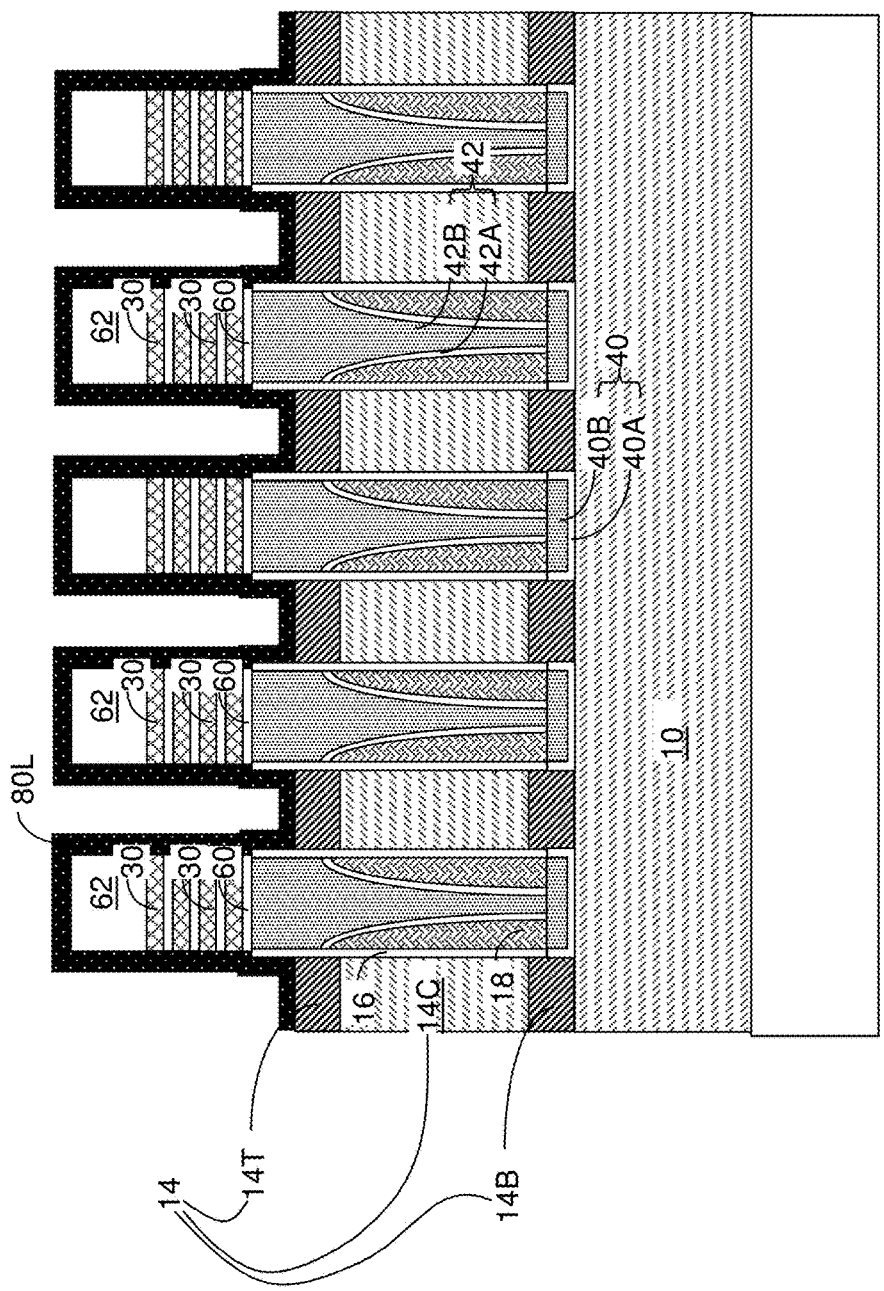
FIG. 3 is a vertical cross-sectional view of the exemplary structure after deposition of a layer stack including memory elements according to an embodiment of the present disclosure.

Referring to FIG. 3, an in-process layer stack 80L including multiple layers can be formed on the surfaces of the alternating stack (30, 60). The layer stack can include, from one side to another, a resistive memory material layer, a tunneling dielectric layer, and a steering element layer.

As used herein, a "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to a portion of a resistive memory material. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric. As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

Metal oxides are characterized by being insulating when initially deposited. A metal oxide can be formed with oxygen deficiencies (e.g., vacancies), or can be annealed to form oxygen deficiencies. The second electrode can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the second electrode and the reversibly resistance-switching material can be lowered by the presence of the oxygen vacancies ($V_O$"). In this case, the interface between the second electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating).

When a large forward bias voltage (such as a negative voltage of about −1.5 volt that is applied to the second electrode with respect to the first electrode) is applied across the reversibly resistance-switching material, the oxygen vacancies drift toward the interface between the high energy barrier material (such as platinum or n-doped polysilicon) and the reversibly resistance-switching material, and as a result, the potential barrier at the interface between the second electrode and the reversibly resistance-switching material is reduced and a relatively high current can flow through the structure. The device is then in its low resistance (conductive) state in which the reversibly resistance-switching material functions as a semiconducting material or a conductive material.

The conductive path can be broken by applying a large reverse bias voltage (such as a positive voltage of about 1.5 volt that is applied to the second electrode with respect to the first electrode) across the reversibly resistance-switching material. Under a suitable reverse bias condition, the oxygen vacancies move away from the proximity of the interface between the high work function material and the reversibly resistance-switching material. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements include hafnium oxide, such as $HfO_x$ where $1.9<x<2.1$. Suitable materials for the first electrode (e.g., word line) are any conducting material such as Ti(O)N, Ta(O)N, TiN, TiAlN, WN and TaN. Suitable materials for the second electrode (e.g., local bit line) include metals and doped semiconductor with a high work function (typically >4.5 eV) capable to getter oxygen in contact with the metal oxide to create oxygen vacancies at the contact. Some examples are TaCN, TiCN, Ru, $RuO_2$, Pt, Ti rich $TiO_x$, TiAlN, TaAlN, TiSiN, TaSiN, $IrO_2$ and doped polysilicon. The thicknesses of the electrodes are typically 1 nm or greater. Thicknesses of the metal oxide can be generally in the range of 2 nm to 20 nm.

The tunneling dielectric layer includes a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0\times10^{19}/cm^3$, and a lightly or lighter doped p-doped semiconductor region (i.e., p− or p region) including p-type dopants at an atomic concentration less than $5.0\times10^{19}/cm^3$. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a second electrode.

Figure 4A:
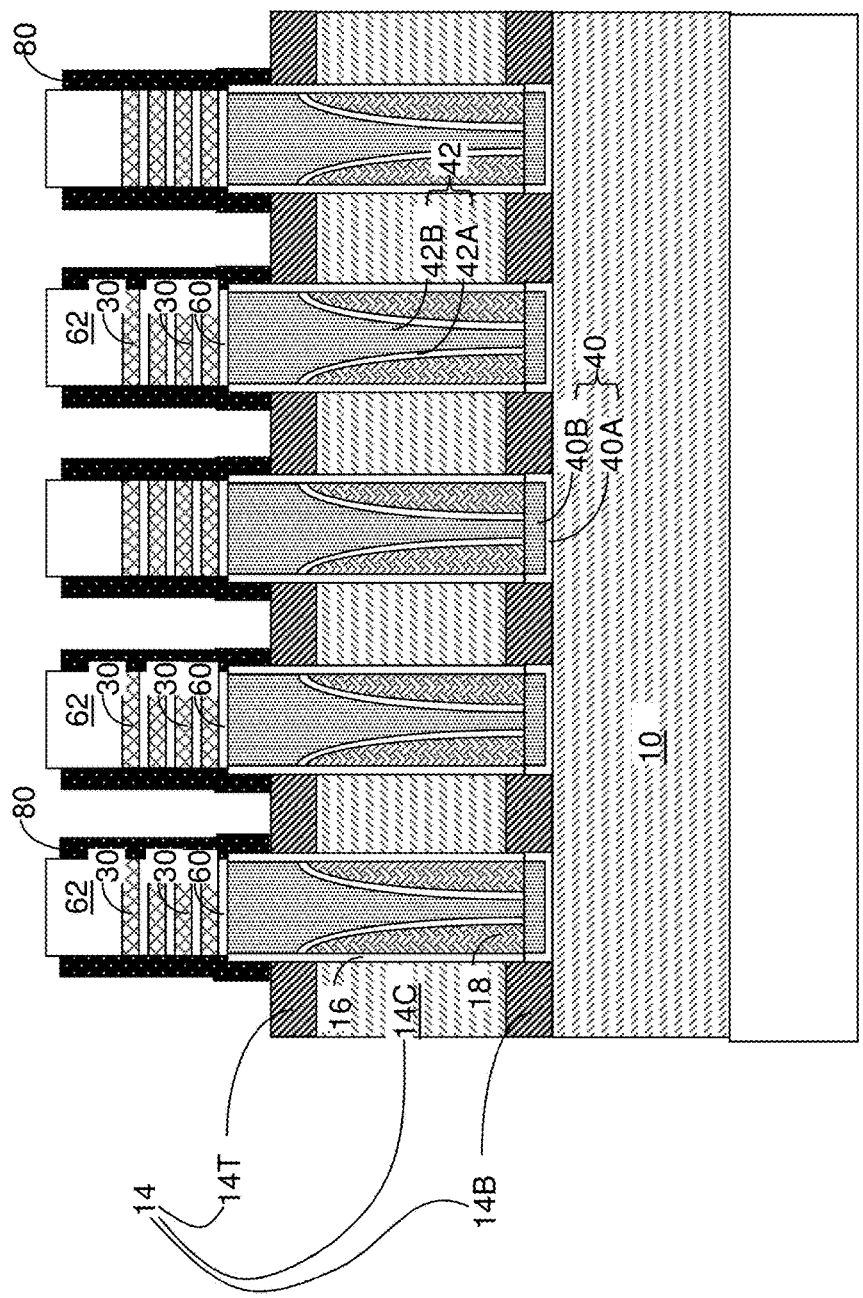
FIG. 4A is a vertical cross-sectional view of the exemplary structure after removal of horizontal portions of the layer stack according to an embodiment of the present disclosure.
Figure 4B:
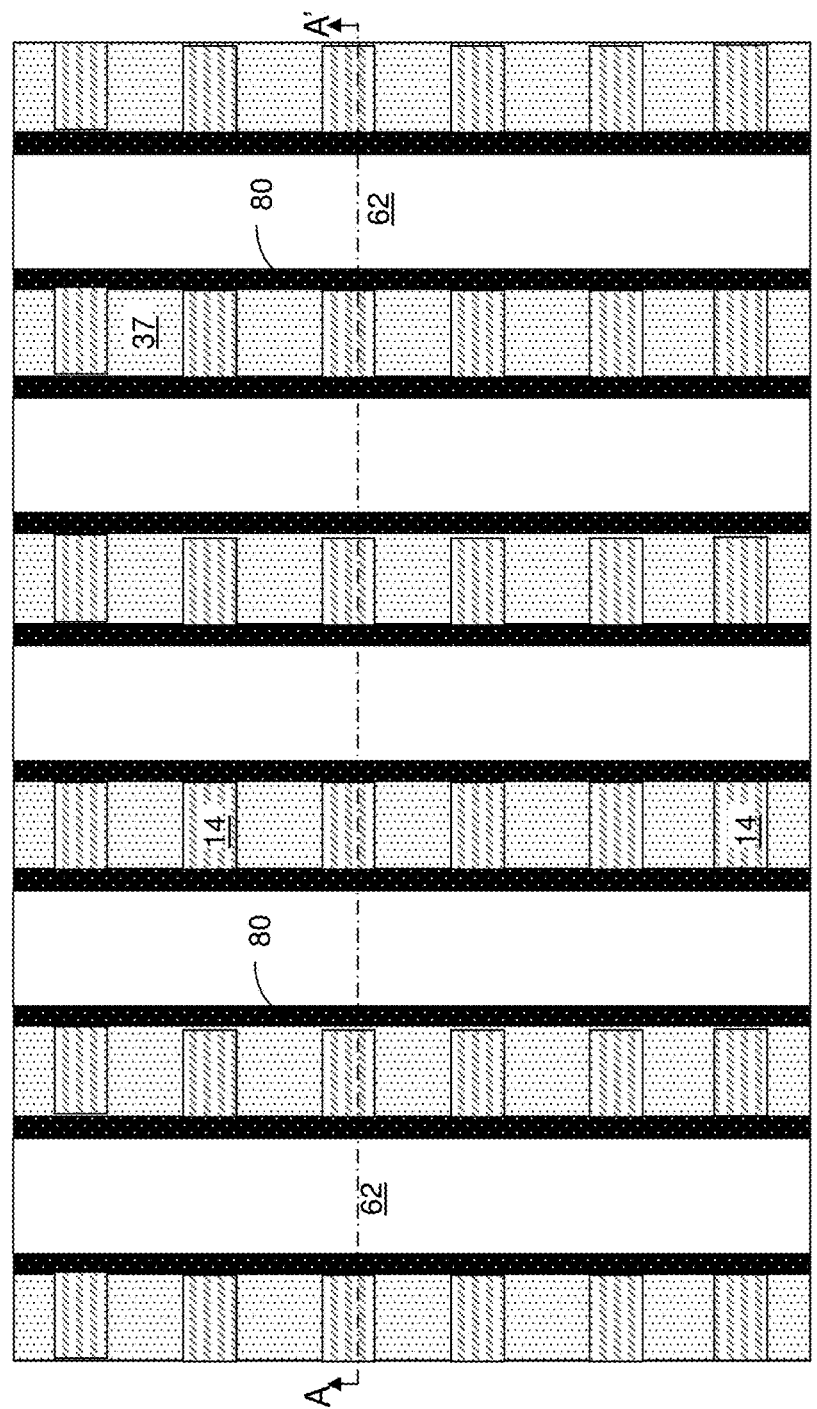
FIG. 4B is a top-down view of the exemplary structure of FIG. 4A. The vertical plane A-A' is the plane of the cross-section for FIG. 4A.

Referring to FIGS. 4A and 4B, an anisotropic etch can be performed to remove horizontal portions of the in-process layer stack 80L. Each remaining vertical portions of the in-process layer stack 80L is a layer stack 80 including, from one side to another, a resistive memory material layer, a tunneling dielectric layer, and a steering element layer.

In one embodiment, each second electrode can be embodied as the electrically conductive layers 30, and each first electrode can be embodied as a vertically-extending electrically conductive line to be subsequently formed on a respective layer stack 80. In another embodiment, each first electrode can be embodied as the electrically conductive layers 30, and each second electrode can be embodied as a vertically-extending electrically conductive line to be subsequently formed on a respective layer stack 80.

Figure 5A:
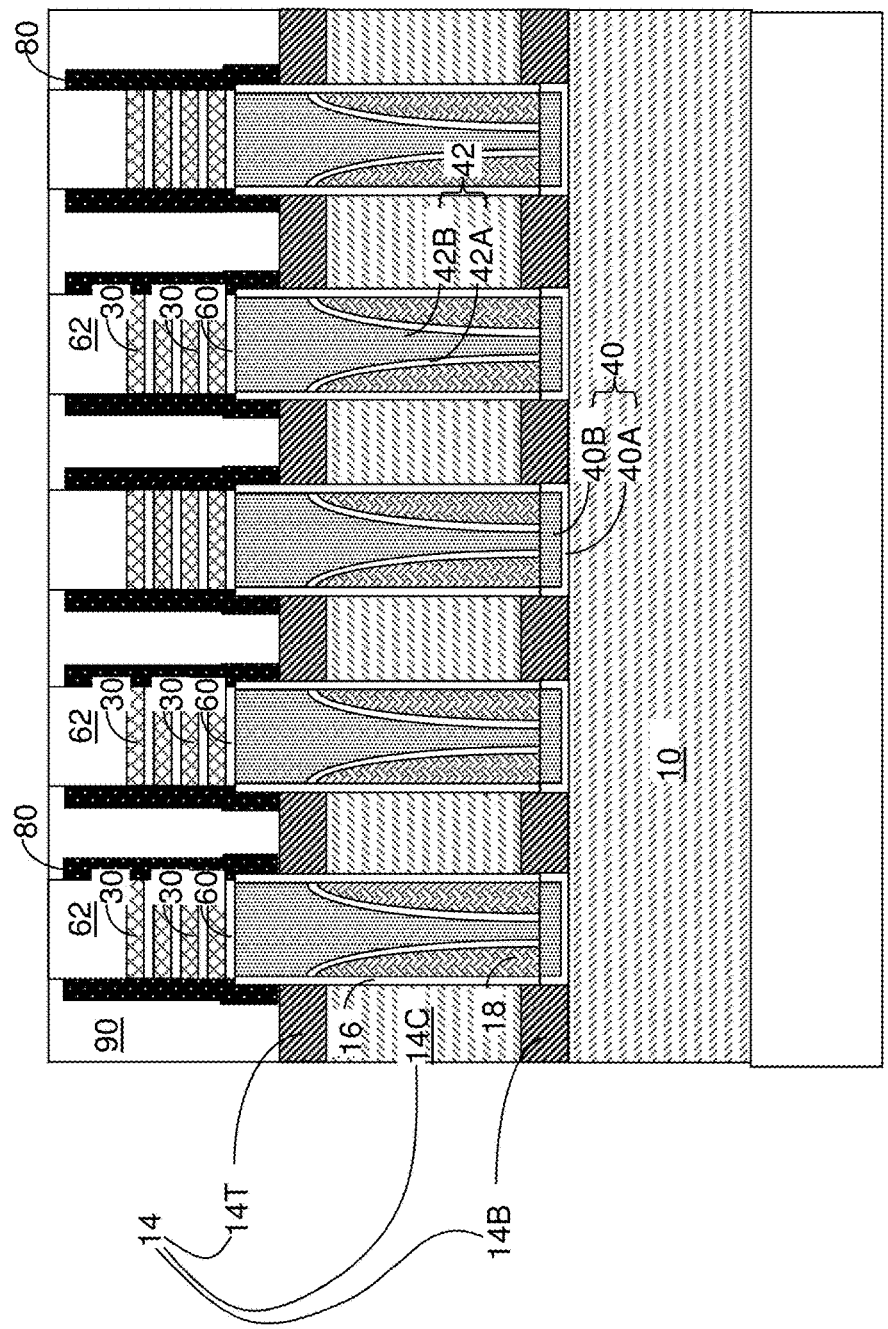
FIG. 5A is a vertical cross-sectional view of the exemplary structure after formation of electrically conductive lines and dielectric pillars according to an embodiment of the present disclosure.
Figure 5B:
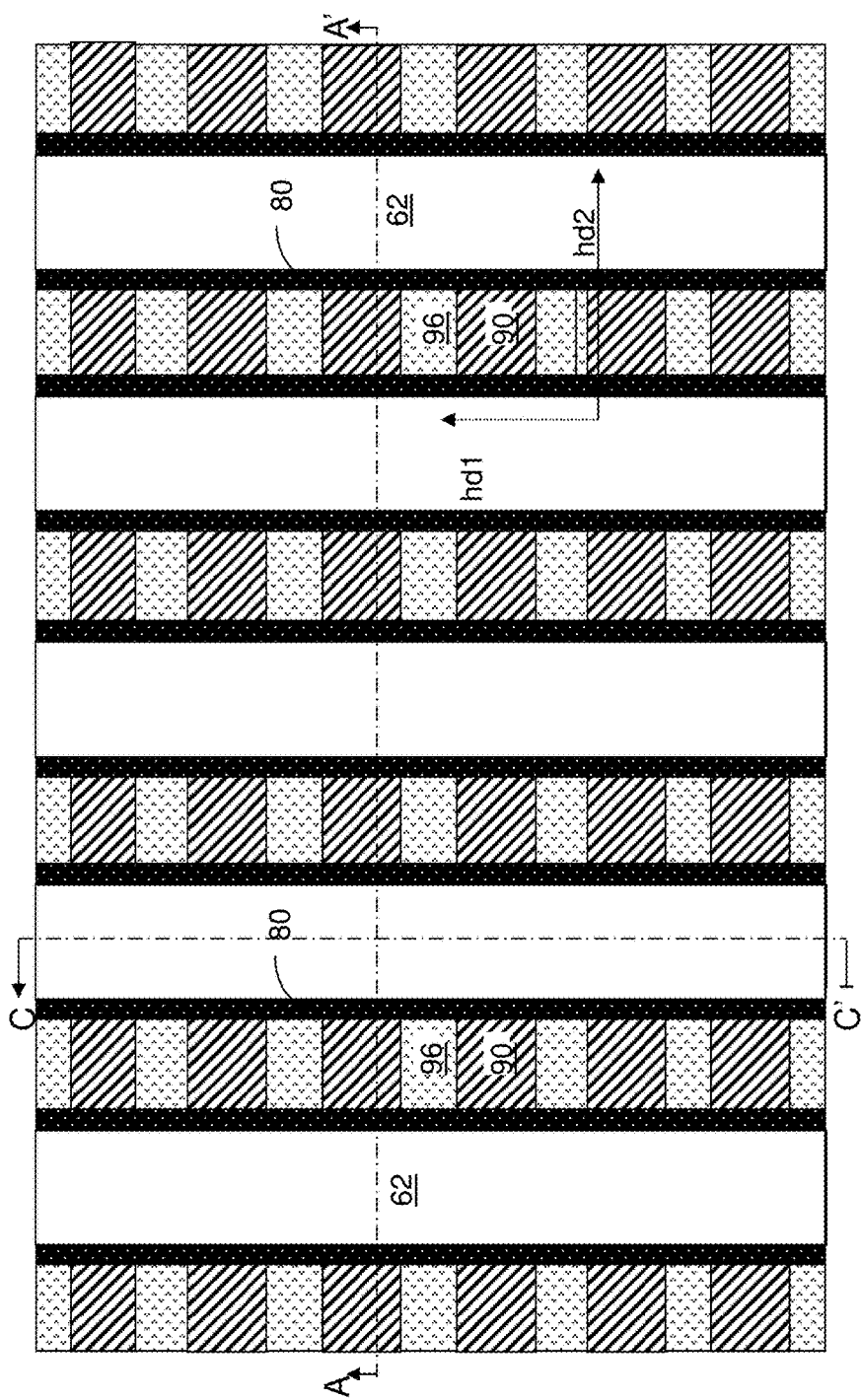
FIG. 5B is a top-down view of the exemplary structure of FIG. 5A. The vertical plane A-A' is the plane of the cross-section for FIG. 5A. The vertical plane C-C' is the plane of the cross-section for FIG. 5C.
Figure 5C:
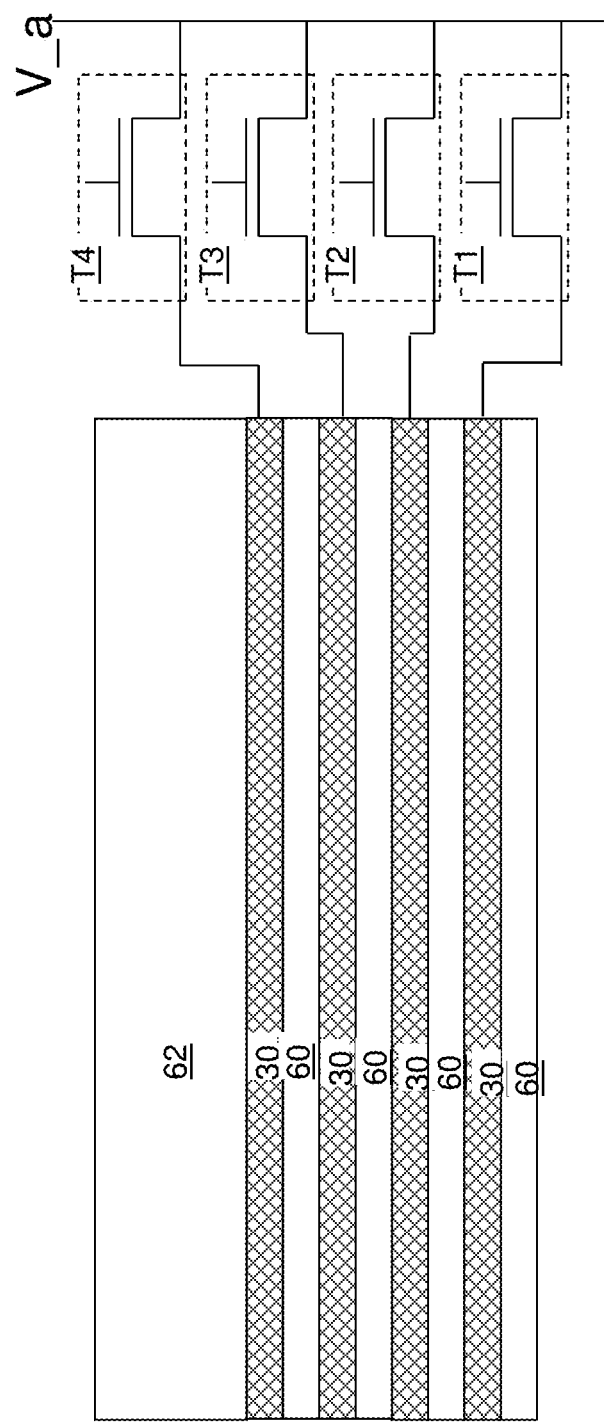
FIG. 5C is another vertical cross-sectional view of the exemplary structure of FIGS. 5A and 5B.

Referring to FIGS. 5A-5C, a laterally alternating stack of electrically conductive lines 90 and dielectric pillar structures 96 is formed within each trench located between a neighboring pair of line stack rail structures (30, 60, 62).

In one embodiment, a second electrically conductive material can be deposited within the trenches among the line stack rail structures (30, 60, 62), for example, by a conformal deposition process. The second electrically conductive material can include a conductive metallic nitride (e.g., TiN), a doped semiconductor material (e.g., polysilicon having p-type or n-type doping concentration greater than $5.0\times10^{19}/cm^3$), an elemental metal, and/or an intermetallic alloy (e.g., TiW) of at least two elemental metals. The second electrically conductive material can be the same as, or can be different from, the first electrically conductive material.

Excess portions of the second electrically conductive material deposited over the horizontal plane including the top surfaces of the line stack rail structures (30, 60, 62) can be removed, for example, by chemical mechanical planarization. Thus, each remaining portion of the deposited second electrically conductive material can fill a trench between a neighboring pair of line stack rail structures (30, 60, 62). Each portion of the deposited second electrically conductive material can be divided into a plurality of electrically conductive lines (e.g., local bit lines) that extend along the vertical direction, for example, by applying a photoresist layer over the top surfaces of the second electrically conductive material portions and the line stack rail structures (30, 60, 62), patterning the photoresist layer to form openings in areas that do not overlie the global bit lines 10, and removing the physically exposed portions of the second electrically conductive material employing a combination of the photoresist layer and the insulating cap portions 62 as an etch mask. Each remaining portion of the second electrically conductive material constitutes an electrically conductive line 90, which can have a shape of a pillar structure. A plurality of electrically conductive lines 90 is formed on the vertically spaced sets of layer stacks 80.

Each of the electrically conductive lines 90 can be formed over an area of a respective vertical field effect transistor (14, 16, 18), which is herein referred to as a first select transistor. Each select transistor can electrically connect a global bit line 10 to an electrically conductive line 90, or can electrically disconnect (i.e., provide an electrical open between) the global bit line 10 and the second electrically conducive line 90. A switched node of each first select transistor (i.e., a top active region 14T) is connected to an end of a respective electrically conductive line 90. Each electrically conductive line 90 can be formed as a generally pillar-shaped structure.

The electrically conductive lines 90 form a two-dimensional array having the same periodicity as the array of vertical field effect transistors (14, 16, 18) (i.e., the first access transistors). The electrically conductive lines 90 are spaced apart from one another by cavities along the first horizontal direction hd1, and by the line stack rail structures (30, 60, 62) along the second horizontal direction hd2.

A dielectric material (such as silicon oxide) can be deposited into the cavities. Excess portions of the dielectric material can be removed from above a horizontal plane including the top surfaces of the line stack rail structures (30, 60, 62) and the electrically conductive lines 90, for example, by chemical mechanical planarization. Dielectric material pillars 96 are formed in each volume of the cavities, i.e., between the electrically conductive lines 90 and between the line stack rail structures (30, 60, 62) (and therefore, between the alternating stacks (30, 60)). In this configuration, the electrically conductive lines 90 are formed as a two-dimensional array in which the electrically conductive lines 90 are spaced from one another by the dielectric material pillars 96 along the first horizontal direction hd1, and by the alternating stacks (30, 60) along the second horizontal direction hd2.

As shown in FIG. 5C, second select transistors (T1-T4) (e.g., word line select transistors) for selectively activating a respective conductive material layer 30 (i.e., word line) can be formed at any suitable stage of the processing sequence. For example, the second select transistors can be formed in, or on, the substrate 6 if the substrate 6 includes a semiconductor substrate. Alternatively or additionally, the second select transistors can be formed prior to, concurrently with, or after formation of the first select transistors (14, 16, 18). Alternatively or additionally, the second select transistors can be formed prior to, or after, formation of the electrically conductive lines 90. Any method for forming transistors as known in the art can be employed to provide the second select transistors. A switched node (e.g., a source region or a drain region) of each second select transistor can be connected to an end of a respective conductive material layer 30, and another node (e.g., a drain region or a source region) can be connected to a voltage source (or current source) which provides a node activation voltage V_a.

In one embodiment, each global bit line 10 laterally extends along the second horizontal direction hd2, and two or more of the first selector transistors (14, 16, 18) can be electrically connected to the global bit line 10. The first select transistors (14, 16, 18) are configured to activate a selected electrically conductive line 90 by supplying an activation voltage thereto from a respective global bit line 10, and the second select transistors (T1-T4) are configured to activate a selected conductive material layer 30 by supplying another activation voltage thereto. In one embodiment, the exemplary structure can include a monolithic three-dimensional memory device comprises a resistive random access memory (ReRAM) device.

Referring to FIG. 6A, a portion of a first exemplary layer stack 80 is illustrated, which includes a steering element 84, a resistive memory element 88 and a tunneling dielectric element 86 located between the steering element 84 and the resistive memory element 88. The layers in the stack 80 may be stacked vertically (i.e., in a direction perpendicular to the top surface of the substrate), horizontally (i.e., in a direction parallel to the top surface of the substrate) or in any one or more directions in between vertical and horizontal. In one embodiment, the stack 80 includes the steering element 84 having a non-linear current-voltage characteristic for electrical current passing therethrough, the tunneling dielectric element 86 contacting the steering element 84, and the resistive memory element 88 contacting the tunneling dielectric element 86. The predominant mode of electrical current conduction through the tunneling dielectric element 86 is charge carrier tunneling such as electron tunneling or hole tunneling. The resistive memory element 88 includes a dielectric material having multiple states providing different electrical resistance depending on an electrical bias that is previously applied thereto.

In one embodiment, a first metallic material portion can be in contact with the steering element 84, and a second metallic material portion can be in contact with the resistive memory element 88. For example, an electrically conductive layer 30 (such as one of the electrically conductive layers 30 in the exemplary structure of FIGS. 5A-5C) can be located in contact with the steering element 84, and an electrically conductive line 90 (such as one of the electrically conductive lines 90 in the exemplary structure of FIGS. 5A-5C) can be located in contact with the resistive memory element 88.

In one embodiment, the steering element 84 includes a diode. For example, the diode can include a first conductivity type semiconductor layer 83 (e.g., an n-doped semiconductor layer) including dopants of a first conductivity type (e.g., n-type dopants) at an atomic concentration greater than $5.0 \times 10^{19}/cm^3$, such as $6.0 \times 10^{19}/cm^3$ to $1.0 \times 10^{21}/cm^3$, a second conductivity type semiconductor region 85 (e.g., a p-doped semiconductor layer) including dopants of a second conductivity type (which is the opposite of the first conductivity type, e.g., p-type dopants) at an atomic concentration less than $5.0 \times 10^{19}/cm^3$, such as $1.0 \times 10^{17}/cm^3$ to $4.0 \times 10^{19}/cm^3$. The thickness of the first conductivity type semiconductor layer 83 can be in a range from 20 nm to 1 micron, and the thickness of the second conductivity type semiconductor layer 85 can be in a range from 2 nm to 100 nm, although lesser and greater thicknesses can also be employed. In one embodiment, the electrically conductive layer 30 and the first conductivity type semiconductor layer 83 can be embodied in a single conductive material layer including a doped semiconductor material having a doping of the first conductivity type.

In one embodiment, the tunneling dielectric element 86 comprises a dielectric material having a dielectric constant of at least 7.0, which can be silicon nitride or a dielectric metal oxide. In one embodiment, the tunneling dielectric element 86 can include a dielectric material selected from silicon nitride and aluminum oxide. In one embodiment, the dielectric constant of element 86 is less than the dielectric constant of element 88. Thus, if the element 88 comprises hafnium oxide having a dielectric constant of 25, then the dielectric constant of element 86 may be between 7 and 24. In one embodiment, the tunneling dielectric element 86 can have a thickness in a range from 0.6 nm to 4 nm (such as from 1 nm to 3 nm), although lesser and greater thicknesses can also be employed.

In one embodiment, the resistive memory element 88 comprises a dielectric oxide of a metal selected from Hf, Ti, Zr and Ta, such as hafnium oxide.

Referring to FIG. 6B, a portion of a second exemplary layer stack 80 is illustrated, which can include the same layer stack as the first exemplary layer stack 80 in FIG. 6A. An electrically conductive layer 30 (such as one of the electrically conductive layers 30 in the exemplary structure of FIGS. 5A-5C) can be located in contact with the resistive memory element 88, and an electrically conductive line 90 (such as one of the electrically conductive lines 90 in the exemplary structure of FIGS. 5A-5C) can be located in contact with the steering element 84. In one embodiment, the electrically conductive line 90 and the first conductivity type semiconductor layer 83 can be embodied in a single conductive material layer including a doped semiconductor material (e.g., n+ polysilicon) having a doping of the first conductivity type.

Referring to FIG. 6C, a portion of a third exemplary layer stack 80 is illustrated, which can be derived from the first exemplary layer stack 80 by providing a metallic liner 89 between the resistive memory element 88 and the electrically conductive line 90. The metallic liner 89 can include a conductive diffusion barrier material such as a conductive metallic nitride (e.g., TiN, TaN, or WN) or a conductive metallic carbide (e.g., TiC, TaC, or WC). The metallic liner 89 can have a thickness in a range from 1 nm to 30 nm, although lesser and greater thicknesses can also be employed.

Referring to FIG. 6D, a portion of a fourth exemplary layer stack 80 is illustrated, which can be derived from the second exemplary layer stack 80 by providing a metallic liner 81 between the steering element 84 and the electrically conductive line 90. The metallic liner 81 can include a conductive diffusion barrier material such as a conductive metallic nitride (e.g., TiN, TaN, or WN) or a conductive metallic carbide (e.g., TiC, TaC, or WC). The metallic liner 81 can have a thickness in a range from 1 nm to 30 nm, although lesser and greater thicknesses can also be employed.

Figure 6E:
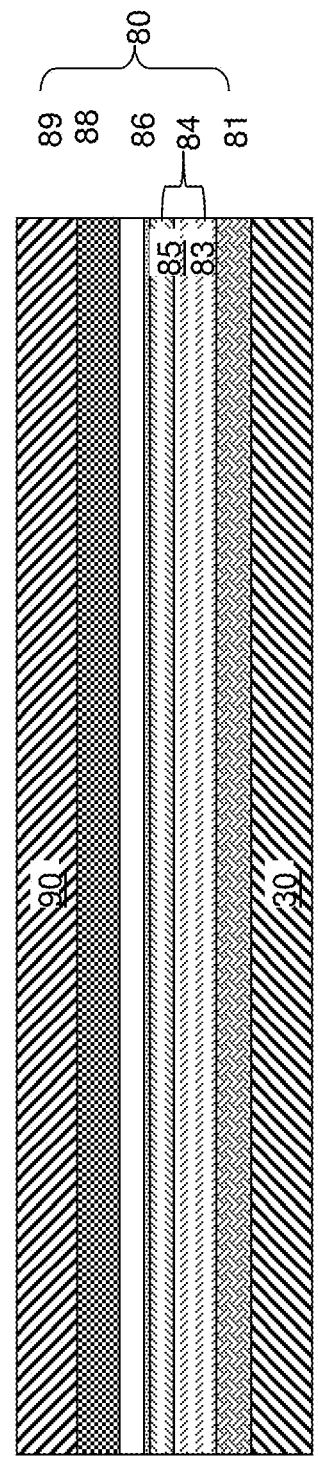
FIG. 6E is a cross-sectional view of a portion of a fifth exemplary layer stack including memory elements of the present disclosure according to an embodiment of the present disclosure.

Referring to FIG. 6E, a portion of a fifth exemplary layer stack 80 is illustrated, which can be derived from the third or fourth exemplary layer stack 80 by providing an additional metallic liner. Specifically, a first metallic liner 81 can be provided between the electrically conductive layer 30 and the steering element 84, and a second metallic liner 89 can be provided between the electrically conductive line 90 and the resistive memory element 88.

The memory element which includes the tunneling dielectric element may provide a more symmetric current-voltage profile for forward and reverse bias modes than a similar memory element which lacks the tunneling dielectric element. The memory element containing both a steering element and the tunneling dielectric element has both a high nonlinearity factor (e.g., greater than 400:1 at 1 Volt, such as 425:1 to 750:1) and a high current density (e.g., greater than $10^5$ A/cm$^2$, such as $5 \times 10^5$ to $1 \times 10^7$ A/cm$^2$).

Figure 7A:
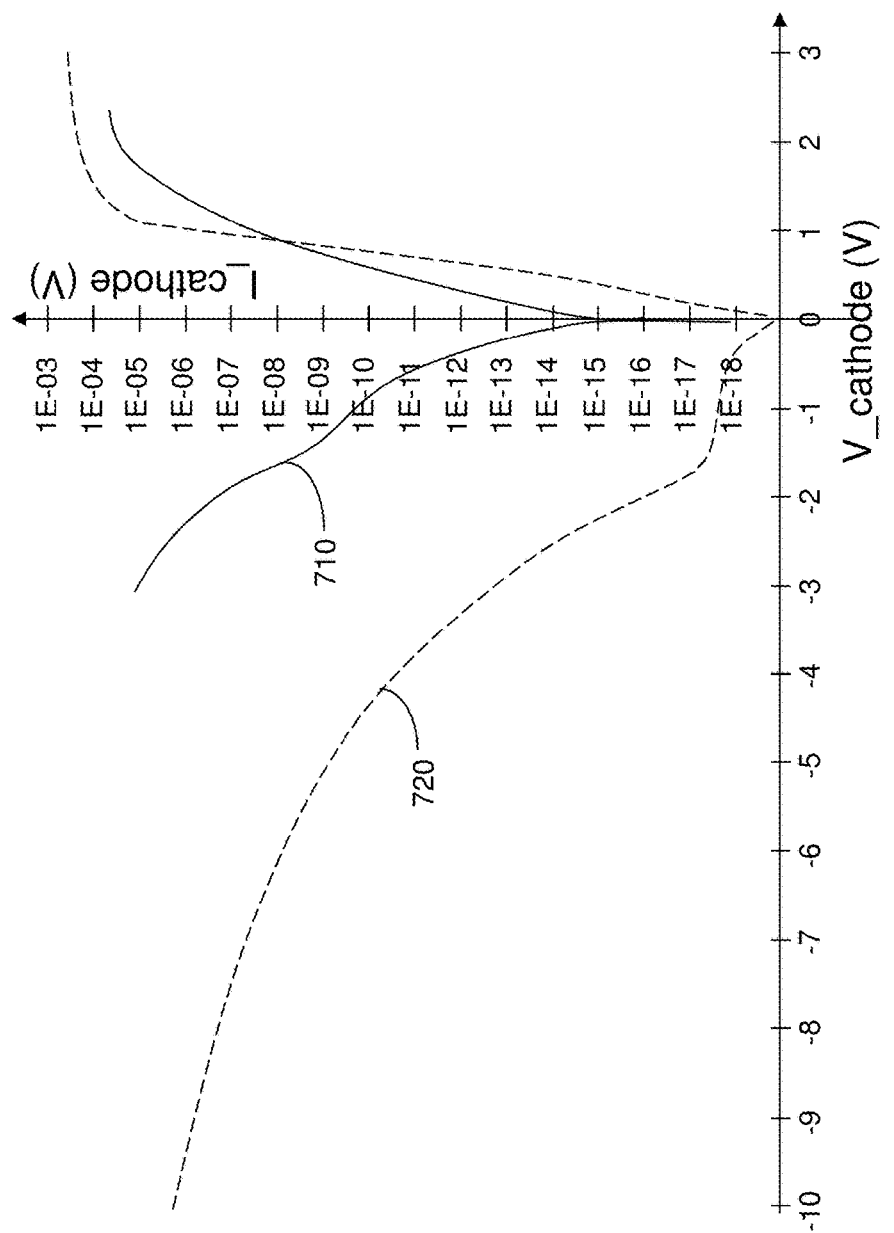
FIG. 7A is a graph illustrating current-voltage characteristics of a diode-tunneling dielectric-metal structure of the present disclosure and of a comparative diode-metal structure.

FIG. 7A illustrates a current-voltage plot 710 of a diode-tunneling dielectric-metal structure of an embodiment the present disclosure, and a current-voltage plot 720 of a comparative diode-metal structure which lacks the tunneling dielectric. The diode-tunneling dielectric-metal structure can be derived from first or second exemplary layer stack 80 illustrated in FIG. 6A or 6B by removing the resistive memory element 88. The comparative diode-metal structure can be derived from the diode-tunneling dielectric-metal structure by removing the tunneling dielectric element 86. Both structures include a second conductivity type (e.g., p-type) semiconductor layer 85 having a doping of about $2.0 \times 10^{19}$/cm$^3$ and having a thickness of 10 nm, while the embodiment structure also includes a silicon nitride tunneling dielectric element 86 having a thickness of 1.0 nm. As can be seen in FIG. 7A, the plot 710 of the embodiment device has a higher symmetry between forward and reverse bias modes (i.e., value of current for positive and negative voltage of the same absolute value) than the plot 720 of the comparative device. Thus, combination of the steering element 84 and the tunneling dielectric element 86 of the embodiment of the present disclosure can be employed as a non-linear switching device that is turned off when the external bias voltage is zero, and is turned on for a forward bias voltage and for a reverse bias voltage having an absolute magnitude as low as 1.0 V to 3.0 V.

Figure 7B:
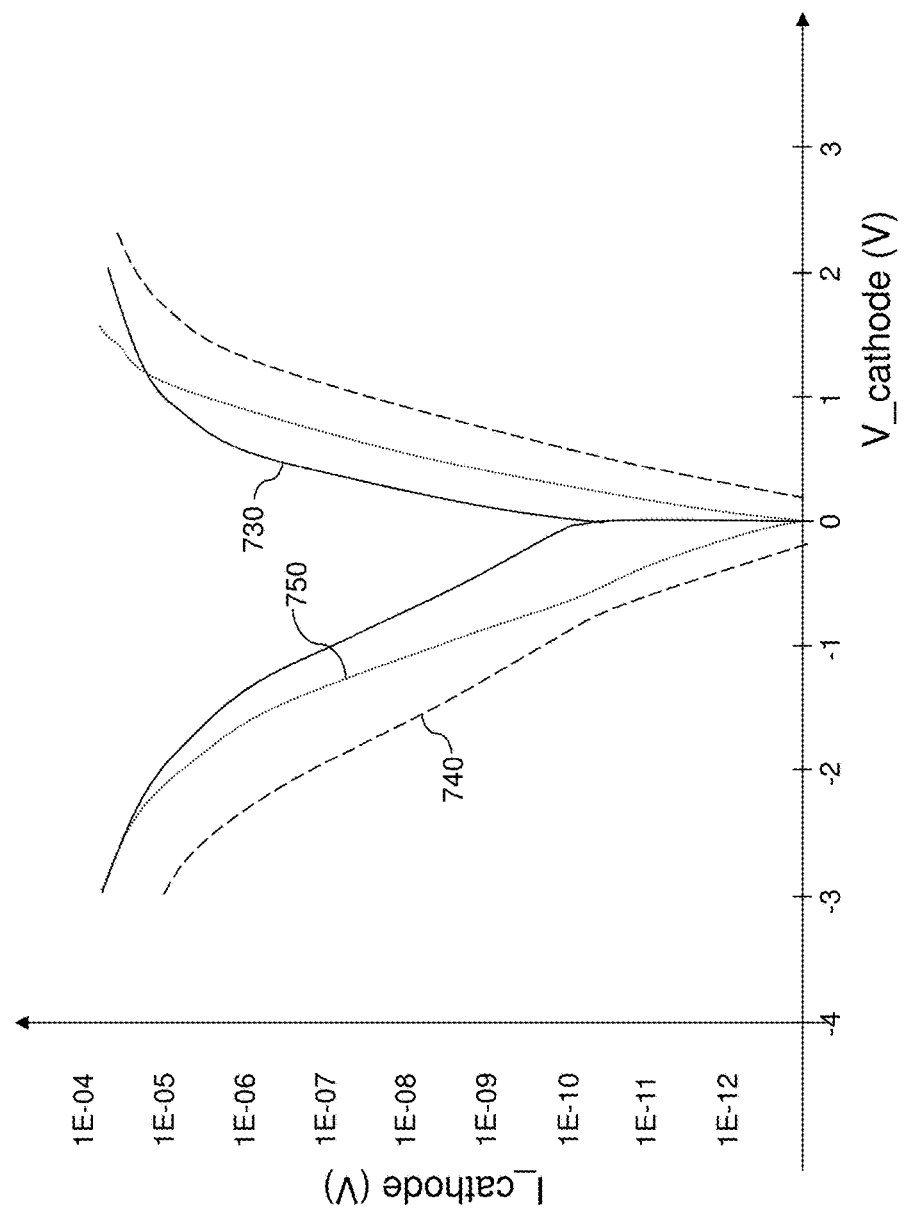
FIG. 7B is a graph illustrating a variation in current-voltage characteristics of a diode-tunneling dielectric-metal structure of the present disclosure as a function of the p-type semiconductor layer doping and thickness.

FIG. 7B is a graph illustrating a variation in current-voltage characteristics of a diode-tunneling dielectric-metal structure of the present disclosure as a function of the p-type semiconductor layer 85 doping and thickness. The diode-tunneling dielectric-metal structure can be derived from first or second exemplary layer stack 80 illustrated in FIG. 6A or 6B by removing the resistive memory element 88. In plot 730, the thickness of the p-type semiconductor layer 85 is about 10 nm and its p-type doping concentration is $1 \times 10^{19}$ cm$^{-3}$. In plot 740, the thickness of the p-type semiconductor layer 85 is also about 10 nm but its p-type doping concentration is increased to $2 \times 10^{19}$ cm$^{-3}$. In plot 750, the thickness of the p-type semiconductor layer 85 is reduced to about 5 nm and its p-type doping concentration is increased to $5 \times 10^{19}$ cm$^{-3}$. As can be seen from these plots, the curves become tighter around the zero volt axis as the thickness and the doping concentration of layer 85 decreases. In other words, a higher current is obtained for the same value of voltage as the thickness and doping concentration of layer 85 decreases. The dependence of the current-voltage performance characteristic(s) of the device on the p-type layer thickness and/or doping concentration permits a flexibility in the design of the memory device. For example, in a method of making the memory device at least one desired current-voltage performance characteristic (e.g., current for an applied voltage) of the device may be determined, such as by being calculated and/or being received from a user of the device. At least one of the thickness and p-type doping concentration of a p-type semiconductor layer of a diode steering element may then be selected which provides the desired current-voltage performance characteristic(s). The thickness and/or doping concentration may be selected from a look-up table based on experimental or calculated data, it may be selected from a graph such as FIG. 7B or it may be calculated. The diode steering element is then fabricated with the n-type semiconductor layer 83 and the p-type semiconductor layer 85 having the selected at least one of thickness and doping concentration. The resistive memory element and the tunneling dielectric element are then formed, such that the tunneling dielectric element is located between the diode steering element and the resistive memory element.

Figure 8A:
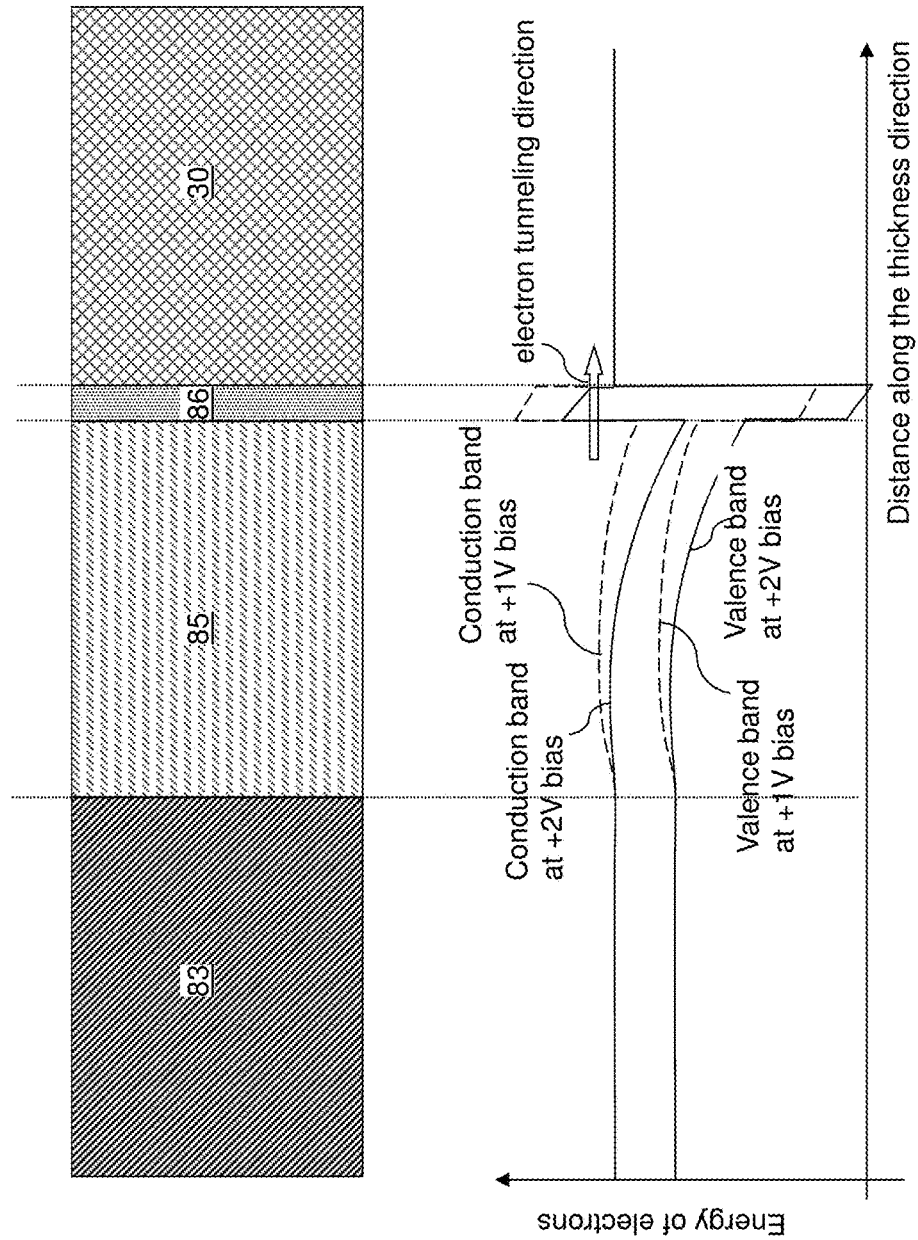
FIG. 8A is a schematic band diagram (i.e., plot of energy in eV versus position in the device in microns) of a layer stack of the present disclosure in a forward bias mode according to an embodiment of the present disclosure.

The operation of the combination of the steering element 84 and the tunneling dielectric element 86 of the present disclosure as a selector element in a forward bias condition is illustrated in FIG. 8A. During a forward bias condition (i.e., application of a 1V and 2V positive voltage to the electrode 30 facing the p-type region of the diode), a high nonlinearity factor (NLF) is provided because of effective reduction of energy barrier (i.e., the lowering of the conduction and valence bands of the p-type silicon layer 85 at the interface with element 86) and enhanced electron tunneling through the tunneling dielectric element 86 from the electrode 30 to layer 85 of the diode. This phenomenon is analogous to formation of an inversion layer in the channel of a field effect transistor for increasing the current conduction in the channel.

Figure 8B:
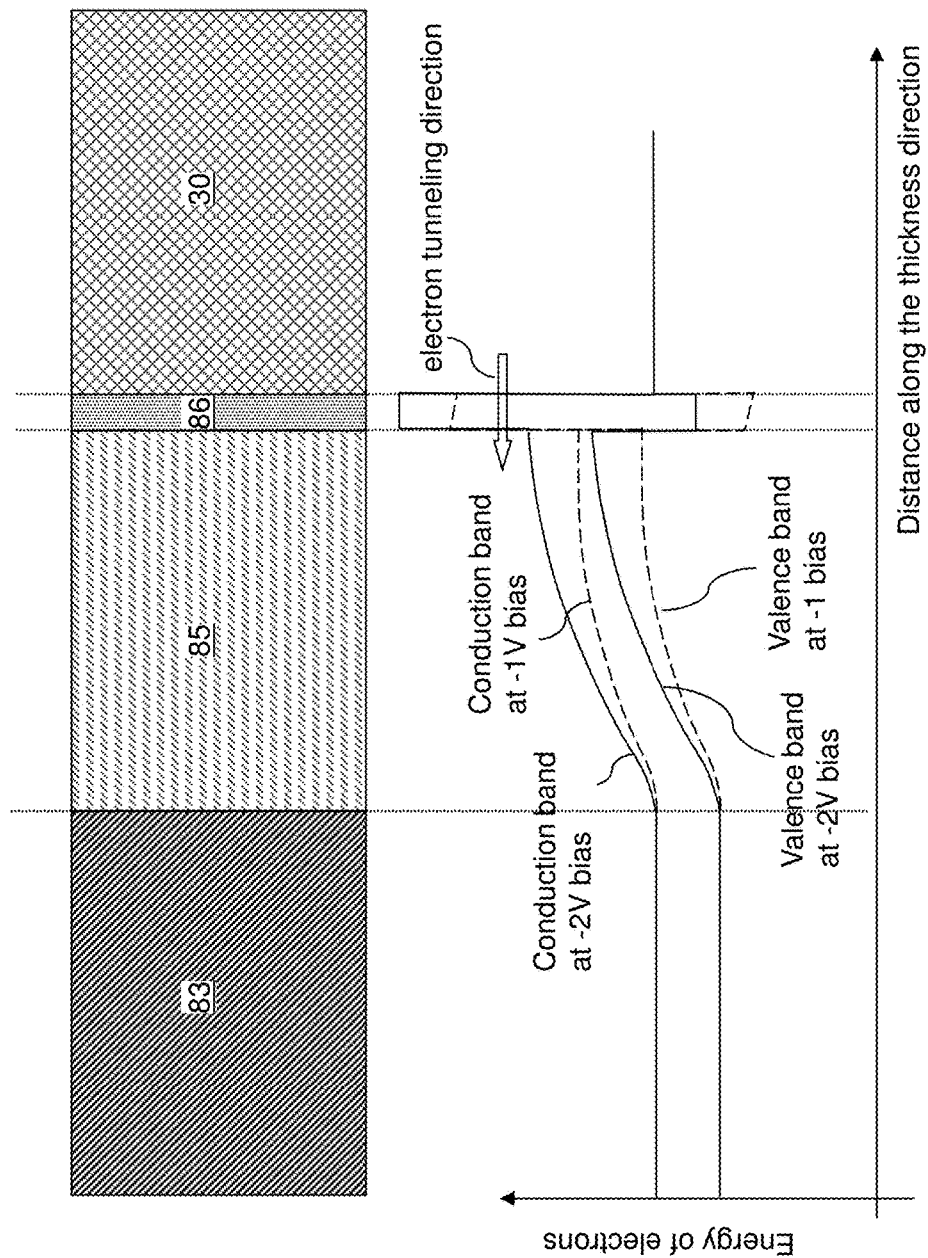
FIG. 8B is a schematic band diagram of the layer stack of FIG. 8A in a reverse bias mode according to an embodiment of the present disclosure.

The operation of the combination of the steering element 84 and the tunneling dielectric element 86 of the present disclosure as a selector element in a reverse bias condition (i.e., application of a −1V and −2V negative voltage to the electrode 30 facing the p-type region of the diode), is illustrated in FIG. 8B. During a reverse bias condition, electrons can tunnel through the tunneling dielectric element 86 from the side of the electrode 30 through element 86. The p-doped semiconductor layer 85 can be in an accumulation mode to provide a significant electrical current through the selector element. In other words, holes accumulate at the boundary between layer 85 and element 86 to lower the conduction and valence bands of layer 85 to facilitate tunneling of electrons from the electrode 30 through element 86 and layer 85 into the n-type semiconductor layer 83.

Figure 8C:
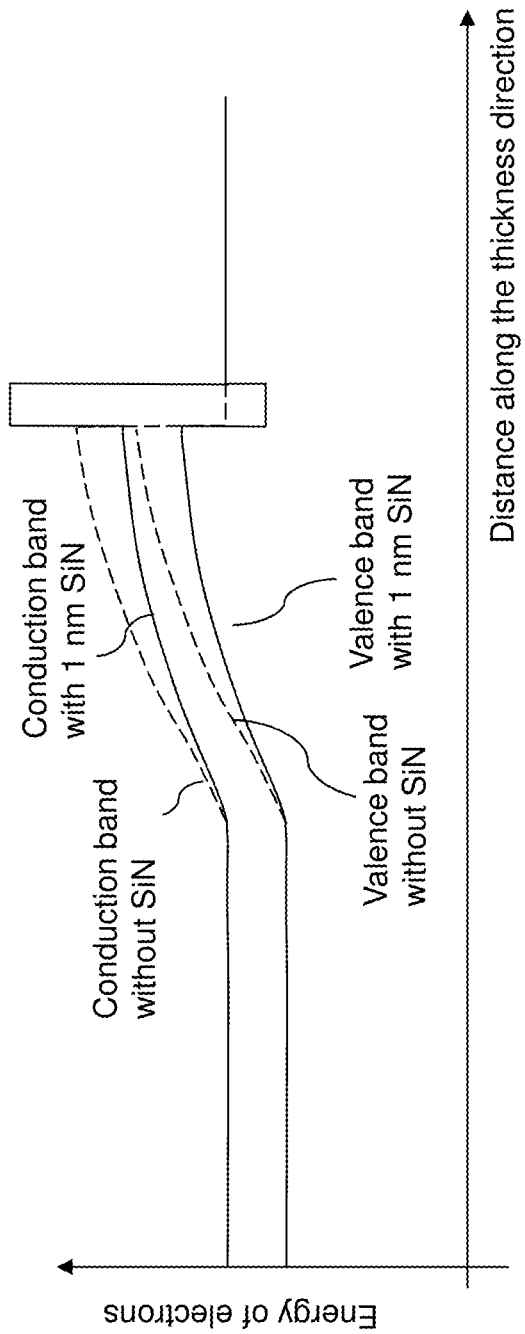
FIG. 8C is a comparative of schematic band diagrams in a reverse bias mode of the layer stack of FIG. 8A and of a comparative example which lacks the tunneling dielectric element.

This effect is illustrated in more detail in FIG. 8C which shows the band gap diagrams of the embodiment device and the comparative device described above in reverse bias condition at −1V. For the same −1V reverse bias, the barrier to electron tunneling from the electrode 30 into the n-type semiconductor layer 83 through the p-type semiconductor layer 85 is higher for the comparative device than for the embodiment device. This is believed to be due to the accumulation of holes in the valence band of layer 85 at the interface with element 86. This results in a lowering of the conduction and valence band energies of layer 85 at the interface with layer 86 and in enhancement of tunneling of electrons from electrode 30 through element 86 and layer 85 into layer 83 due to the lower tunneling barrier (i.e., lower conduction band energy) in layer 85. Thus, the embodiment device provides a more symmetric forward and reverse bias current-voltage characteristic and provides a lower current density for the same voltage or the same current density for a lower voltage than the comparative device.

In summary, the present inventors realized that symmetric prior art steering devices, such as metal-insulator-metal (MIM) and metal-semiconductor-metal (MSM) suffer from the nonlinearity factor ("NLF")-current tradeoff: thicker films have excellent NLF but drop too much voltage (and thus current decreases); thinning the films requires less voltage drop but their NLF is degraded. A prior art forward-biased diode provides high NLF and high current capacity, but at the cost of being highly asymmetric.

In contrast, the present inventors realized that using the diode with a thin lightly doped p-type region and a heavily doped n-type region in series with the tunneling dielectric element in the forward bias condition (i.e., mode) provides a high NLF and a high current, and in the reverse bias condition (i.e., mode) provides a comparable or better performance than the MSM structure. It provides a high current and good symmetry while trading off the high NLF similar to the MSM structure. The embodiment device can be used in forward bias mode for RESET operation, where the highest current and the lowest voltage are desirable.

Furthermore, the present inventors realized that addition of tunneling dielectric element adjacent to the p-type semiconductor regions of the diode reduces the asymmetry in the diode current-voltage behavior in forward and reverse bias modes. This is believed to be due to the facilitation of electron tunneling from the cathode electrode 30 to the p– layer 83 through the element 86. This is believed to occur because the p– layer 83 is in accumulation in the presence of layer 86 and the field direction is conducive for electron tunneling. This improves the current in the reverse bias direction and makes the I-V plot more symmetric in forward and bias modes. Thus, it is believed that element 86 mitigates asymmetry of the standard p-n diode selector current-voltage behavior in forward and reverse bias modes. Furthermore, as described with respect to FIG. 7B, the combined current-voltage characteristics of the device (e.g., of the steering element including the diode, the tunneling dielectric and the conductor, such as a metal) may be tuned by adjusting the thickness and/or the doping concentration of p-type layer 85. This improves the flexibility in the design of the device by obtaining the desired current-voltage characteristics of the device by selecting a specific thickness and doping concentration of the p-type layer 85.

The layer stack 80 of the present disclosure can be embodied in many different configurations, and can be formed employing many different sets of processing steps. The following exemplary manufacturing methods and structures are non-limiting exemplary implementations of the layer stack 80 of the present disclosure.

In embodiments illustrated in FIGS. 9A-9D and 10A-10D, an alternating stack of insulating layers 60 and spacer material layers can be formed as an alternating stack of insulating layers 60 and sacrificial material layers 33 during formation of the exemplary structure of FIGS. 5A-5C (e.g., at the processing step corresponding to FIGS. 2A and 2B). The sacrificial material layers 33 can then be replaced with electrically conductive layers (e.g., word lines) 30 during a subsequent step. In these embodiments, the tunneling dielectric element 86 and/or the steering element 84 are optional and may or may not be included in the memory cells. In other words, in these embodiments, the memory cell may include the resistive memory element 88 and portions of a word line 30 and bit line 90, and optionally one or both of the tunneling dielectric element 86 and/or the steering element 84.

The sacrificial material layers 33 can include a material that can be removed selective to the material of the insulating layers 60 in a subsequent processing step. For example, the insulating layers 60 can include silicon oxide (such as silicon dioxide, fluorosilicate glass, borosilicate glass, borophosphosilicate glass, phosphosilicate glass, and organosilicate glass), and the sacrificial material layers 33 can include silicon nitride or amorphous or polycrystalline semiconductor material (such as polysilicon).

Figures 9A, 9B, 9C, 9D:
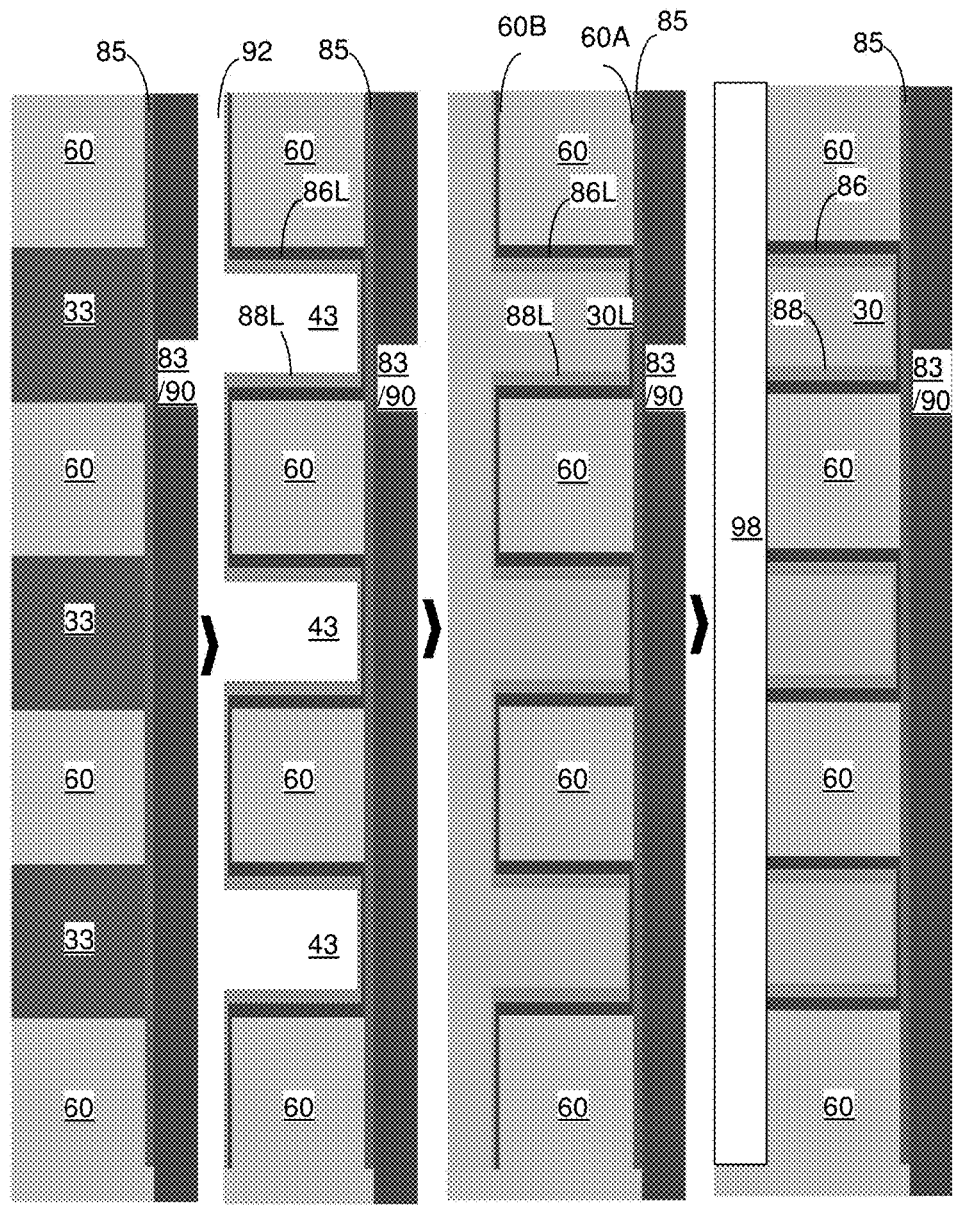
FIGS. 9A-9D illustrate sequential vertical cross-sectional views of a method of making a first exemplary three-dimensional memory device employing an embodiment of the layer stack of the present disclosure.

Referring to FIGS. 9A-9D, a first exemplary three-dimensional memory device employing an embodiment of the layer stack 80 of the present disclosure is illustrated at various stages of a manufacturing process. As shown in FIG. 9A, an alternating stack of insulating layers 60 and sacrificial material layers 33 that alternate along a first direction is formed over a substrate. The substrate can be, for example, the substrate 6 of the exemplary structure of FIGS. 1A and 1B, or can be any other substrate that can provide mechanical support to the alternating stack. The first direction may be a vertical direction that is perpendicular to the substrate as illustrated in FIGS. 2A and 2B, or may be a horizontal direction. The alternating stack can be patterned to form sidewalls that extend along the first direction. A combination of lithographic methods and an etch process can be employed to form the sidewalls of the alternating stack. For example, the processing steps of FIGS. 2A and 2B may be employed to form the sidewalls of the alternating stack. In one embodiment, the sidewalls of the alternating stack may be within a same plane (i.e., a two-dimensional Euclidean plane).

A doped semiconductor layer (e.g., polysilicon) can be formed on the sidewalls of the alternating stack (33, 60). The doped semiconductor layer is herein referred to as a second conductivity type semiconductor layer 85. The conductivity type of the second conductivity type semiconductor layer 85 is herein referred to as a second conductivity type. The second conductivity type may be p-type or n-type. In one embodiment, the second conductivity type can be p-type. In one embodiment, the atomic concentration of the dopants of the second conductivity type can be less than $5.0 \times 10^{19}/cm^3$, although greater atomic concentrations can also be employed.

Another doped semiconductor layer (herein referred to as a first conductivity type semiconductor layer 83) having a doping of the opposite conductivity type can be formed on the second conductivity type semiconductor layer 85 to provide a continuous p-n junction. The direction of the thickness of the first conductivity type semiconductor layer 83 is herein referred to as a second direction. The first conductivity type semiconductor layer 83 extends at least along the first direction, and may extend along a third direction that is perpendicular to the first direction and to the second direction. The extent of the first conductivity type semiconductor layer 83 as deposited may have a greater extent along the first direction than along the second and third directions, thereby rendering the first conductivity type semiconductor layer 83 to be an electrically conductive line 90. Alternatively or additionally, the first conductivity type semiconductor layer 83 can be subsequently patterned such that each remaining portion of the first conductivity type semiconductor layer 83 extends farther along the first direction than along the second and third directions, thereby rendering each remaining portion of the first conductivity type semiconductor layer 83 to be an electrically conductive line 90. Thus, the electrically conductive line 90 can be formed by depositing a first conductivity type semiconductor layer 83 having a doping of a first conductivity type over the sidewalls of the alternating stack (33, 60).

The layer stack 80 employed in the first exemplary three-dimensional memory device can be the same as a modification of the exemplary structure of FIG. 6B in which the first conductivity type semiconductor layer 83 functions as the electrically conductive line 90. Thus, a structure (83/90) that is both an electrically conductive line 90 and a first conductivity type semiconductor layer 83 extends along the first direction over the sidewalls of the alternating stack (33, 60). The second conductivity type semiconductor layer 85 is interposed between the electrically conductive line 90 and the sidewalls of the alternating stack (33, 60). The electrically conductive line 90 is formed on the second conductivity type semiconductor layer 85.

Each portion of the p-n junction between the first and second conductivity type semiconductor layers (83, 85) that is located adjacent to a sidewall of the sacrificial material layers 33 constitutes a steering element. Each steering element comprises a portion of a continuous p-n junction between the first and second conductivity type semiconductor layers (83, 85). Each of the steering elements comprises a diode.

As shown in FIG. 9B, a backside trench 92 is formed in the stack. The sacrificial material layers 33 can be removed selective to the insulating layers 60 and to the second conductivity type semiconductor layer 85 through the trench 92 by an etch process, which can be an isotropic etch process or an anisotropic etch process. In an illustrative example, the insulating layers 60 can include silicon oxide, the sacrificial material layers 33 can include silicon nitride, and the etch process can be a wet etch process employing phosphoric acid. In another illustrative example, the insulating layers 60 can include silicon oxide, the sacrificial material layers 33 can include germanium or a silicon-germanium alloy, and the etch process can be a wet etch process employing hydrogen peroxide. Recesses 43 are formed in volumes from which the sacrificial material layers 33 are removed. The recesses 43 as initially formed are cavities bounded by surfaces of the insulating layers 33 and physically exposed surfaces of the second conductivity type semiconductor layer 85.

Tunneling dielectric elements are formed by depositing a tunneling dielectric layer 86L through the trench 92 within the recesses 43 and directly on surfaces of the insulating layers 33 and directly on surfaces of the steering elements (83, 85) by any suitable method, such as atomic layer deposition (ALD). Each tunneling dielectric element is a portion of the tunneling dielectric layer 86L that is located in proximity to a steering element, i.e., a portion of the p-n junction in proximity to the recesses 43. In one embodiment, the tunneling dielectric layer 86L can include a dielectric material having a dielectric constant of at least 7.0 (such as silicon nitride or a dielectric metal oxide), and can have a thickness in a range from 0.6 nm to 4 nm.

Resistive memory elements are formed as a resistive memory material layer 88L through the trench 92 within the recesses 43 and on the tunneling dielectric elements (as embodied as the tunneling dielectric layer 86L), such as a hafnium oxide layer formed by ALD. Each resistive memory element includes a portion of the resistive memory material layer 86L that is separated from the second conductivity type semiconductor layer 85 by the thickness of the tunneling dielectric layer 86L. In other words, each resistive memory element is a portion of the resistive memory material layer 86L that is in contact with a portion of the tunneling dielectric layer 86L which contacts the second conductivity type semiconductor layer 85.

As shown in FIG. 9C, a continuous electrically conductive layer 30L can be formed by depositing at least one conductive material in the remaining portions of the recesses 43 as a continuous material layer. All remaining volumes of the recesses 43 may be filled by the continuous electrically conductive layer. In one embodiment, the continuous electrically conductive layer 30L can include at least one electrically conductive material selected from a metal nitride, an elemental metal, and an intermetallic alloy of at least two elemental metals. Alternatively or additionally, the continuous electrically conductive layer 30L can include a doped semiconductor material, such as doped polysilicon.

The proximal sidewalls 60A of the insulating layers 60 contact the steering elements (83, 85), and the distal sidewalls 60B of the insulating layers 60 do not contact the steering elements (83, 85). As shown in FIG. 9D, the continuous electrically conductive layer 30L, the resistive memory material layer 88L, and, optionally, the tunneling dielectric layer 86L can be divided into discrete portions by removing portions in the trench 92 that are spaced from the steering elements (83, 85) by the insulating layers 30. Specifically, portions of the continuous electrically conductive layer 30L, the resistive memory material layer 88L, and optionally, the tunneling dielectric layer 86L in the trench 92 that are farther away from the first and second conductivity type semiconductor layers (83, 85) than the distal surfaces of the insulating layers 60 can be removed, for example, by an anisotropic etch employing an etch mask layer, which may be a patterned photoresist layer (not shown) and/or a topmost insulating layer 60 (or 62 in FIG. 5A) in case the first direction is a vertical direction. Dielectric fill material portions 98 can be formed in trench 92 formed by removal of portions of the continuous electrically conductive layer 30L, the resistive memory material layer 88L, and optionally, the tunneling dielectric layer 86L.

Each remaining discrete portion of the continuous electrically conductive layer 30L constitutes an electrically conductive layer 30 (e.g., word line). Each remaining discrete portion of the resistive memory material layer 88L constitutes a resistive memory element 88. In case the tunneling dielectric layer 86L is divided into discrete portions, each remaining portion of the tunneling dielectric layer 86L constitutes a tunneling dielectric element 86. A combination of an electrically conductive layer 30, a resistive memory element 88, and a tunneling dielectric element 86 can be formed within each recess 43. Each combination of a resistive memory element 88, a tunneling dielectric element 86, and a steering element that is a portion of the first and second conductivity type semiconductor layers (83, 85) that is proximal to a respective tunneling dielectric element 86 collectively constitutes a memory cell. An array of memory cells arranged along the first direction is provided. Each of the memory cells comprises a steering element (83, 85), a tunneling dielectric element 86, and a resistive memory element 88. At least one element of each memory cell is formed within a respective recess 43. Thus, the n+ polysilicon pillars act as both the n+ layer 83 of the diode and as the vertical bit lines 90.

Figures 10A, 10B, 10C, 10D:
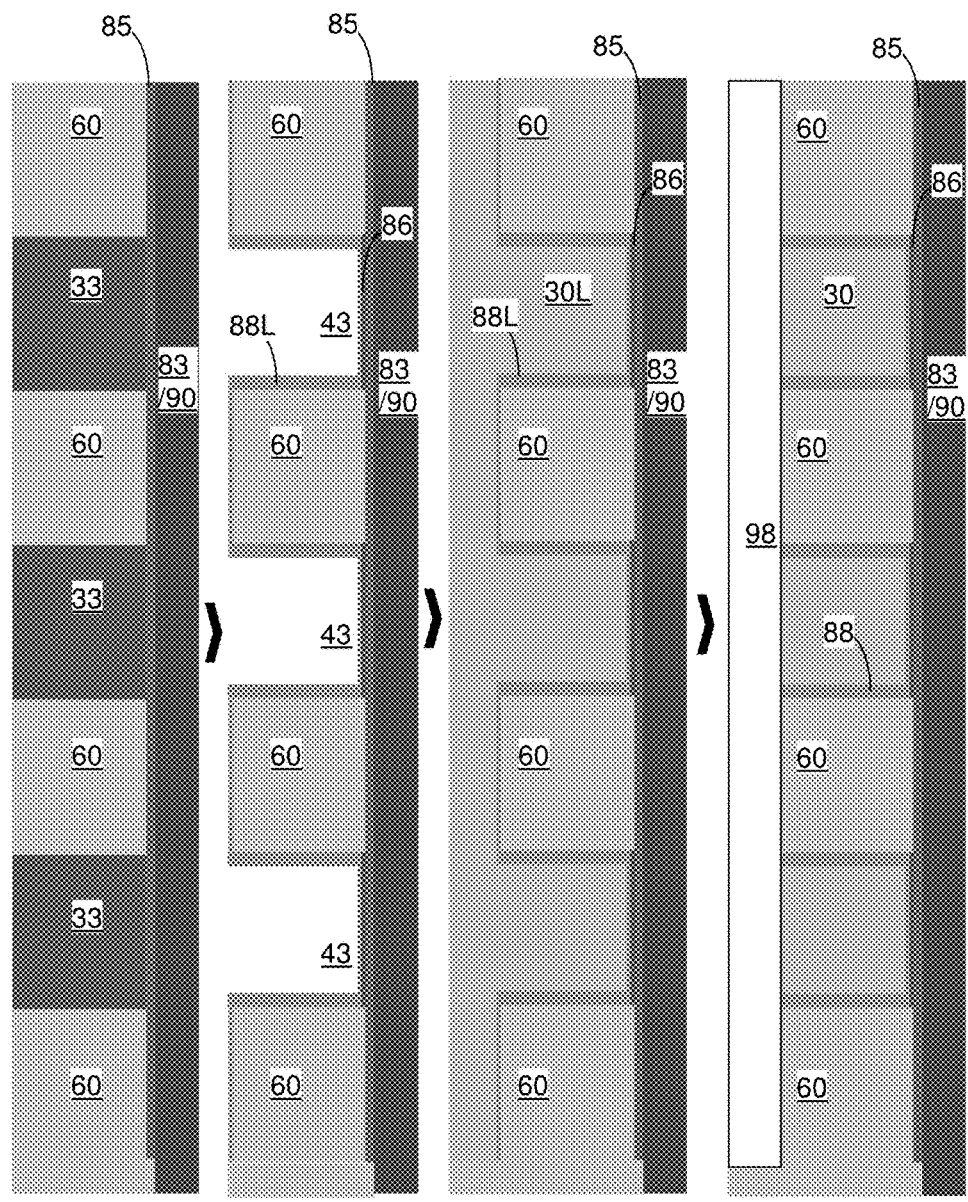
FIGS. 10A-10D illustrate sequential vertical cross-sectional views of a method of making a second exemplary three-dimensional memory device employing an embodiment of the layer stack of the present disclosure.

Referring to FIGS. 10A-10D, a second exemplary three-dimensional memory device employing an embodiment of the layer stack 80 with discrete portions of element 86 of the present disclosure is illustrated at various stages of a manufacturing process. As shown in FIG. 10A, an alternating stack of insulating layers 60 and sacrificial material layers 33 that alternate along a first direction is formed over a substrate, and is patterned to form sidewalls as in the processing steps of FIG. 9A. A second conductivity type semiconductor layer 85 and a first conductivity type semiconductor layer 83 are sequentially formed as in the processing steps of FIG. 9A. As shown in FIG. 10B, recesses 43 are formed by partially or fully removing the sacrificial material layers 33 selective to the insulating layers 60 and to the second conductivity type semiconductor layer 85 employing an etch process as in the processing steps of FIG. 9B.

Tunneling dielectric elements 86 are formed as discrete dielectric material portions (e.g., discrete strips or segments) that are self-aligned to portions of the steering elements that are physically exposed to the recesses 43. For example, the silicon nitride sacrificial layers 33 are partially removed by etching to leave discrete silicon nitride segments or strips 86 at the end of the recesses 43. Alternatively, layers 33 are fully removed and then separate tunneling dielectric elements 86 can be formed by a self-aligned formation process such as nitridation of surface portions of the second conductivity type semiconductor layer 85 that are physically exposed to the recesses 43. In one embodiment, each tunneling dielectric element 86 can include a dielectric material having a dielectric constant of at least 7.0 (such as silicon nitride or a dielectric metal oxide), and can have a thickness in a range from 0.6 nm to 4 nm.

Resistive memory elements are formed as a resistive memory material layer 88L within the recesses 43 and on the tunneling dielectric 86. Processing steps of FIG. 9B may be employed to form the resistive memory material layer 88L.

As shown in FIG. 10C, a continuous electrically conductive layer 30L can be formed by depositing at least one conductive material in the remaining portions of the recesses 43 as a continuous material layer. Processing steps of FIG. 9C may be employed to form the continuous electrically conductive layer 30L.

As shown in FIG. 10D, the continuous electrically conductive layer 30 and the resistive memory material layer 88L can be divided into discrete portions by removing portions that are spaced from the steering elements (83, 85) by the insulating layers 30 employing the same methods as in the processing steps of FIG. 9D. Each remaining discrete portion of the continuous electrically conductive layer 30L constitutes an electrically conductive layer 30. Each remaining discrete portion of the resistive memory material layer 88L constitutes a resistive memory element 88. Dielectric fill material portions 98 can be formed in trenches formed by removal of portions of the continuous electrically conductive layer 30L and the resistive memory material layer 88L.

Figures 11A, 11B, 11C, 11D:
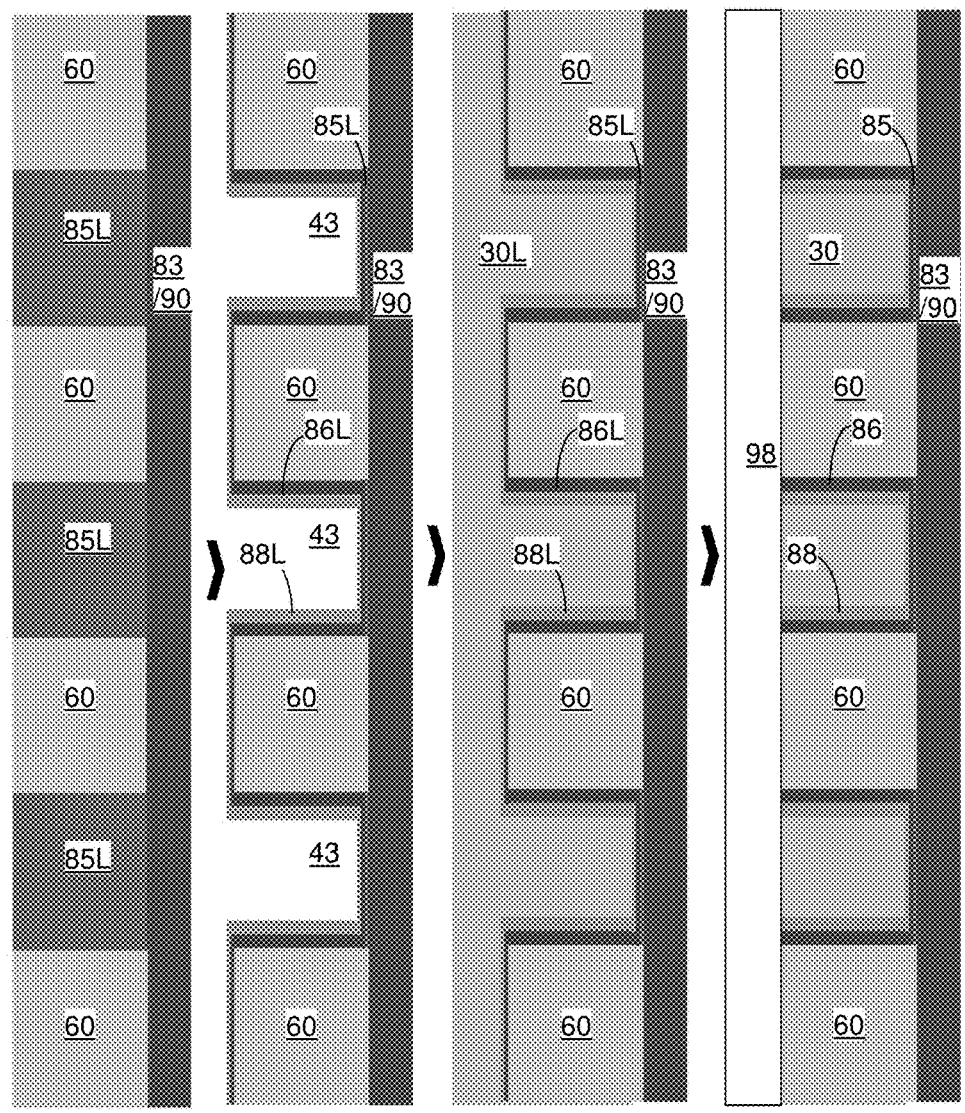
FIGS. 11A-11D illustrate sequential vertical cross-sectional views of a method of making a third exemplary three-dimensional memory device employing an embodiment of the layer stack of the present disclosure.

Referring to FIGS. 11A-11D, a third exemplary three-dimensional memory device employing an embodiment of the layer stack 80 with local (i.e., discrete) diodes of the present disclosure is illustrated at various stages of a manufacturing process. As shown in FIG. 11A, an alternating stack of insulating layers 60 and doped semiconductor layers 85L of the second conductivity type that alternate along a first direction is formed over a substrate, and is patterned to form sidewalls as in the processing steps of FIG. 9A. The first direction may be a vertical direction that is perpendicular to the substrate as illustrated in FIGS. 2A and 2B, or may be a horizontal direction.

The doped semiconductor layers 85L include a doped semiconductor material including electrical dopants. The conductivity type of the doped semiconductor layer 85L is a second conductivity type, and as such, the doped semiconductor layers 85L are second conductivity type semiconductor layers. The second conductivity type may be p-type or n-type. In one embodiment, the second conductivity type can be p-type. In one embodiment, the atomic concentration of the dopants of the second conductivity type can be less than $5.0 \times 10^{19}/\text{cm}^3$, although greater atomic concentrations can also be employed.

The alternating stack can be patterned to form sidewalls that extend along the first direction. A combination of lithographic methods and an etch process can be employed to form the sidewalls of the alternating stack. For example, the processing steps of FIGS. 2A and 2B may be employed to form the sidewalls of the alternating stack. In one embodiment, the sidewalls of the alternating stack may be within a same plane (i.e., a two-dimensional Euclidean plane).

A first conductivity type semiconductor layer 83 can be formed on the sidewalls of the alternating stack (85L, 60) to provide a plurality of discrete p-n junctions that are located within a same plane as sidewalls of the insulating layers 60. The first conductivity type semiconductor layer 83 is a doped semiconductor layer having a doping of a first conductivity type (which is the opposite conductivity type of the second conductivity type). For example, if the first conductivity type is p-type, the second conductivity type is n-type, and vice versa. The direction of the thickness of the first conductivity type semiconductor layer 83 is herein referred to as a second direction. The first conductivity type semiconductor layer 83 extends at least along the first direction, and may extend along a third direction that is perpendicular to the first direction and to the second direction. The extent of the first conductivity type semiconductor layer 83 as deposited may have a greater extent along the first direction than along the second and third directions, thereby rendering the first conductivity type semiconductor layer 83 to be an electrically conductive line 90. Alternatively or additionally, the first conductivity type semiconductor layer 83 can be subsequently patterned such that each remaining portion of the first conductivity type semiconductor layer 83 extends farther along the first direction than along the second and third directions, thereby rendering each remaining portion of the first conductivity type semiconductor layer 83 to be an electrically conductive line 90. Thus, the electrically conductive line 90 can be formed by depositing a first conductivity type semiconductor layer 83 having a doping of a first conductivity type over the sidewalls of the alternating stack (85L, 60).

The layer stack 80 employed in the third exemplary three-dimensional memory device can be the same as a modification of the exemplary structure of FIG. 6B in which the first conductivity type semiconductor layer 83 functions as the electrically conductive line 90. Thus, a structure (83/90) that is both an electrically conductive line 90 and a first conductivity type semiconductor layer 83 extends along the first direction over the sidewalls of the alternating stack (85L, 60).

As shown in FIG. 11B, the doped semiconductor layers 85L can be partially removed through the backside trench selective to the insulating layers 60 by an etch process, which can be an isotropic etch process or an anisotropic etch process. In an illustrative example, the insulating layers 60 can include silicon oxide, the doped semiconductor layers 85L includes a p-doped or n-doped polysilicon material, and the etch process can include a dry etch employing hydrogen chloride, or can be a wet etch process employing KOH. In one embodiment, each doped semiconductor layer 85L can be partially removed to leave an unetched portion, which is herein referred to as a second conductivity type semiconductor layer 85. The thickness of the second conductivity type semiconductor layers 85 along the second direction can be in a range from 5 nm to 30 nm, although lesser and greater thicknesses can also be employed. Each second conductivity type semiconductor layer 85 is self-aligned to a portion of a sidewall of the first conductivity type semiconductor layer 83 located between a neighboring pair of insulating layers 60. Recesses 43 are formed in volumes from which portions of the doped semiconductor layers 85L are removed. The recesses 43 as initially formed are cavities bounded by surfaces of the insulating layers 60 and physically exposed surfaces of the second conductivity type semiconductor layer 85.

Alternatively, the doped semiconductor layers 85L may be completely removed, and the second conductivity type semiconductor layers 85 may be formed employing a self-aligned formation method such as gas phase doping or ion implantation on surface portions of the first conductivity type semiconductor layer 83, or by selective deposition of a doped semiconductor material on the physically exposed surfaces of the first conductivity type semiconductor layer 83 on the side of the recesses 43. In one embodiment, selective epitaxy or a selective semiconductor deposition process can be employed for selective deposition of the doped semiconductor material. Electrical dopants of the second conductivity type can be introduced into the second conductivity type semiconductor layers 85 by in-situ doping and/or by gas phase doping.

A p-n junction that is formed between the first conductivity type semiconductor layer 83 and each of the second conductivity type semiconductor layers 85 constitutes a steering element. In other words, each steering element comprises a discrete p-n junction between the first conductivity type semiconductor layer 83 and a second conductivity type semiconductor layer 85 adjacent to a recess 43 Each of the steering elements comprises a diode.

In one embodiment, tunneling dielectric elements can be formed by depositing a tunneling dielectric layer 86L within the recesses 43 and directly on surfaces of the insulating layers 60 and directly on surfaces of the steering elements (83, 85). Each tunneling dielectric element can be a portion of the tunneling dielectric layer 86L that is located in proximity to a steering element, i.e., a portion of the p-n junction in proximity to the recesses 43. In one embodiment, the tunneling dielectric layer 86L can include a dielectric material having a dielectric constant of at least 7.0 (such as silicon nitride or a dielectric metal oxide), and can have a thickness in a range from 0.6 nm to 4 nm.

Alternatively, tunneling dielectric elements 86 can be formed as discrete dielectric material portions that are self-aligned to portions of the steering elements that are physically exposed to the recesses 43. For example, the tunneling dielectric elements 86 can be formed by a self-aligned formation process such as nitridation of surface portions of the second conductivity type semiconductor layer 85 that are physically exposed to the recesses 43. In one embodiment, each tunneling dielectric element 86 can include a dielectric material having a dielectric constant of at least 7.0 (such as silicon nitride or a dielectric metal oxide), and can have a thickness in a range from 0.6 nm to 4 nm.

Resistive memory elements are formed as a resistive memory material layer 88L within the recesses 43 and on the tunneling dielectric layer 86L (or on tunneling dielectric elements 86). Processing steps of FIG. 9B may be employed to form the resistive memory material layer 88L.

As shown in FIG. 11C, a continuous electrically conductive layer 30L can be formed by depositing at least one conductive material in the remaining portions of the recesses 43 as a continuous material layer. Processing steps of FIG. 9C may be employed to form the continuous electrically conductive layer 30L.

As shown in FIG. 11D, a continuous electrically conductive layer 30 and the resistive memory material layer 88L can be divided into discrete portions by removing portions that are spaced from the steering elements (83, 85) by the insulating layers 60 employing the same methods as in the processing steps of FIG. 9D. Each remaining discrete portion of the continuous electrically conductive layer 30L constitutes an electrically conductive layer 30 (e.g., word line). Each remaining discrete portion of the resistive memory material layer 88L constitutes a resistive memory element 88. Dielectric fill material portions 98 can be formed in cavities formed by removal of portions of the continuous electrically conductive layer 30L, the resistive memory material layer 88L, and, optionally, the tunneling dielectric layer 86L. Layer 83/90 forms a vertical pillar bit line.

In embodiments illustrated in FIGS. 12A-12C and 13A-13C, an alternating stack of insulating layers 60 and spacer material layers can be formed as an alternating stack of insulating layers 60 and conductive material layers 30 during formation of the exemplary structure of FIGS. 5A-5C (e.g., at the processing step corresponding to FIGS. 2A and 2B). The conductive material layers 30 are permanent layers that are not removed in subsequent processing steps. For example, the insulating layers 60 can include silicon oxide (such as silicon dioxide, fluorosilicate glass, borosilicate glass, borophosphosilicate glass, phosphosilicate glass, and organosilicate glass). The conductive material layers 30 can include a doped semiconductor material having a doping of a first conductivity type and functioning as first conductivity type semiconductor layers 83 as in the embodiment illustrated in FIG. 12A, or can include a metallic material and/or a doped semiconductor material as in the embodiment illustrated in FIG. 13A.

Figures 12A, 12B, 12C:
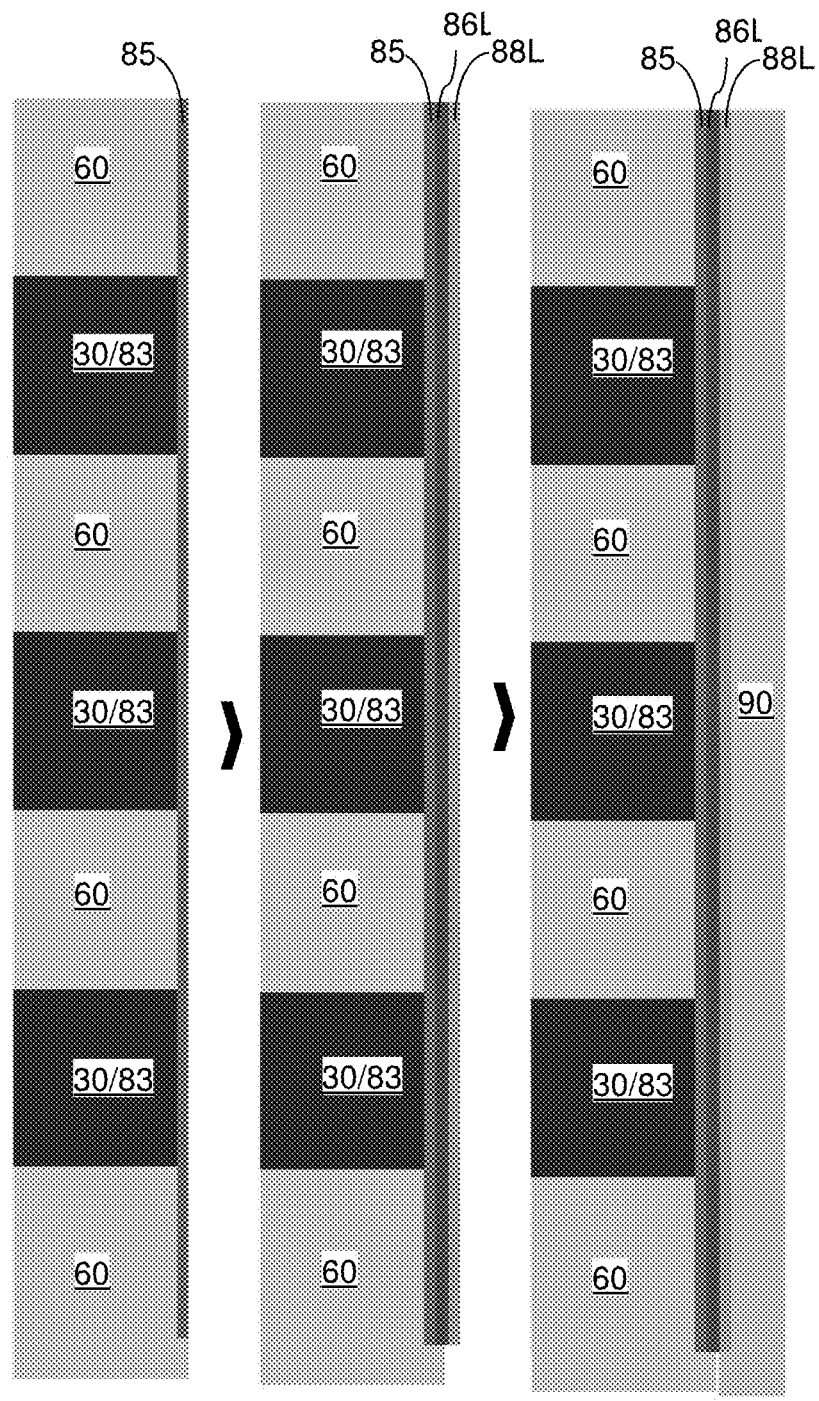
FIGS. 12A-12C illustrate sequential vertical cross-sectional views of a method of making a fourth exemplary three-dimensional memory device employing an embodiment of the layer stack of the present disclosure.

Referring to FIG. 12A, a fourth exemplary three-dimensional memory device employing an embodiment of the layer stack 80 of the present disclosure is illustrated at various stages of a manufacturing process. An alternating stack of insulating layers 60 and conductive material layers 30 that alternate along a first direction is formed over a substrate. The substrate can be, for example, the substrate 6 of the exemplary structure of FIGS. 1A and 1B, or can be any other substrate that can provide mechanical support to the alternating stack. The first direction may be a vertical direction that is perpendicular to the substrate as illustrated in FIGS. 2A and 2B, or may be a horizontal direction.

The conductive material layers 30 include a doped semiconductor material having a doping of a first conductivity type and functioning as first conductivity type semiconductor layers 83. In other words, a structure (30/83) that functions as a conductive material layer 30 and a first conductivity type semiconductor layer 83 is formed between each neighboring pair of insulating layers 60. The first conductivity type may be p-type or n-type. In one embodiment, the first conductivity type can be n-type (i.e., layer 30/83 is both a word line and the n+ portion of the diode). In one embodiment, the atomic concentration of the dopants of the first conductivity type can be greater than $5.0 \times 10^{19}/\text{cm}^3$, although greater atomic concentrations can also be employed.

The alternating stack can be patterned to form sidewalls that extend along the first direction. A combination of lithographic methods and an etch process can be employed to form the sidewalls of the alternating stack. For example, the processing steps of FIGS. 2A and 2B may be employed to form the sidewalls of the alternating stack. In one embodiment, the sidewalls of the alternating stack may be within a same plane (i.e., a two-dimensional Euclidean plane).

A layer stack including a continuous doped semiconductor layer 85, a tunneling dielectric layer 86L, and a resistive memory material layer 88L are formed over the sidewalls of the alternating stack (30, 60). The continuous doped semiconductor layer has a doping of a second conductivity type that is the opposite of the first conductivity type, and is herein referred to as a second conductivity type semiconductor layer 85. In one embodiment, the second conductivity type can be p-type. In one embodiment, the atomic concentration of the dopants of the second conductivity type can be less than $5.0 \times 10^{19}/cm^3$, although greater atomic concentrations can also be employed. A plurality of discrete p-n junctions are formed at interfaces between the second conductivity type semiconductor layer 85 and each of the first conductivity type semiconductor layers 83. Each steering element comprises a portion of a p-n junction between the first and second conductivity type semiconductor layers (83, 85). Each of the steering elements comprises a diode.

The layer stack 80 employed in the fourth exemplary three-dimensional memory device can be the same as a modification of the exemplary structure of FIG. 6A in which the first conductivity type semiconductor layer 83 functions as the electrically conductive layer 30 (e.g., word line). Thus, a structure (83/30) that is both an electrically conductive layer 30 and a first conductivity type semiconductor layer 83 (i.e., both word line and n+ region of the diode) is present between each neighboring pair of insulating layers 60. The second conductivity type semiconductor layer 85 is located over the sidewalls of the alternating stack (30, 60), and can be formed as a planar layer extending over an entirety of the sidewalls of the alternating stack (30, 60) and contacting the entirety of the sidewalls of the alternating stack (30, 60) and having a uniform thickness throughout. Thus, the device includes vertically stacked, horizontally extending n+ layers 30/83 between insulating layers 60 and vertically extending p-layer 85 on the sidewall of the stack to form the local diodes.

As shown in FIG. 12B, tunneling dielectric elements are formed by depositing a tunneling dielectric layer 86L over the sidewalls of the alternating stack (30, 60) and on the second conductivity type semiconductor layer 85. Each tunneling dielectric element is a portion of the tunneling dielectric layer 86L that is located in proximity to a steering element, i.e., a p-n junction between the second conductivity type semiconductor layer 85 and one of the first conductivity type semiconductor layers 83. In one embodiment, the tunneling dielectric layer 86L can include a dielectric material having a dielectric constant of at least 7.0 (such as silicon nitride or a dielectric metal oxide), and can have a thickness in a range from 0.6 nm to 4 nm. The tunneling dielectric layer 86L can be formed as a planar layer extending over an entirety of the sidewalls of the alternating stack (30, 60) and having a uniform thickness throughout.

Resistive memory elements are formed as a resistive memory material layer 88L over the sidewalls of the alternating stack (30, 60) and on the tunneling dielectric elements (as embodied as the tunneling dielectric layer 86L). Each resistive memory element includes a portion of the resistive memory material layer 88L that is proximal to a steering element as embodied as a p-n junction between the second conductivity type semiconductor layer 85 and a first conductivity type semiconductor layer 83. The resistive memory material layer 88L can be formed as a planar layer extending over an entirety of the sidewalls of the alternating stack (30, 60) and having a uniform thickness throughout.

As shown in FIG. 12C, at least one electrically conductive line 90 can be formed on the resistive memory material layer 88L. The electrically conductive line 90 includes at least one metallic material and/or a doped semiconductor material. The at least one metallic material can include an elemental metal, a conductive metallic nitride, a conductive metallic carbide, an intermetallic alloy, and/or a metal-semiconductor alloy.

The direction perpendicular to the plane of the p-n junctions is herein referred to as a second direction. Each electrically conductive line 90 extends at least along the first direction, and may extend along a third direction that is perpendicular to the first direction and to the second direction. The extent of each electrically conductive line 90 as deposited may have a greater extent along the first direction than along the second and third directions. Alternatively or additionally, the electrically conductive line 90 can be deposited as a conductive material layer, and can be subsequently patterned such that each remaining portion of the electrically conductive line 90 extends farther along the first direction than along the second and third directions (e.g., line 90 forms a vertical bit line pillar).

Figures 13A, 13B, 13C:
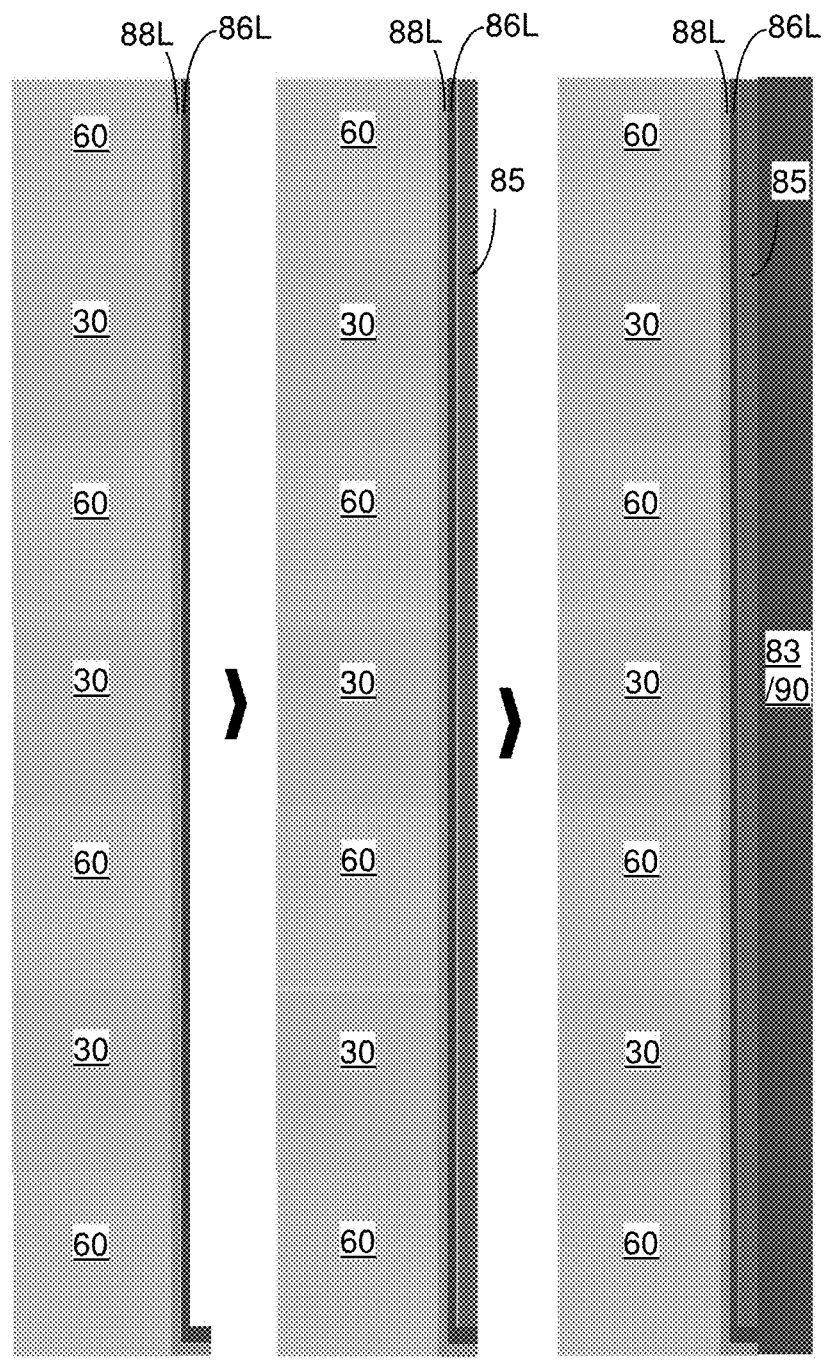
FIGS. 13A-13C illustrates sequential vertical cross-sectional views of a method of making a fifth exemplary three-dimensional memory device employing an embodiment of the layer stack of the present disclosure.

Referring to FIGS. 13A-13C, a fifth exemplary three-dimensional memory device employing an embodiment of the layer stack 80 of the present disclosure is illustrated at various stages of a manufacturing process. As shown in FIG. 13A, an alternating stack of insulating layers 60 and conductive material layers 30 that alternate along a first direction is formed over a substrate. The substrate can be, for example, the substrate 6 of the exemplary structure of FIGS. 1A and 1B, or can be any other substrate that can provide mechanical support to the alternating stack. The first direction may be a vertical direction that is perpendicular to the substrate as illustrated in FIGS. 2A and 2B, or may be a horizontal direction. In one embodiment, the conductive material layers 30 may include at least one metallic material selected from a metal nitride, an elemental metal, and an intermetallic alloy of at least two elemental metals. Alternatively or additionally, the conductive material layers 30 may include a semiconductor material and/or a metal-semiconductor alloy. In other words, the word line 30 is separate from the n+ layer 83 of the diode in this embodiment.

The alternating stack can be patterned to form sidewalls that extend along the first direction. A combination of lithographic methods and an etch process can be employed to form the sidewalls of the alternating stack. For example, the processing steps of FIGS. 2A and 2B may be employed to form the sidewalls of the alternating stack. In one embodiment, the sidewalls of the alternating stack may be within a same plane (i.e., a two-dimensional Euclidean plane).

As shown in FIG. 13B, a layer stack including a resistive memory material layer 88L, a tunneling dielectric layer 86L, and a continuous doped semiconductor layer (i.e., a second conductivity type semiconductor layer 85) can be formed over the sidewalls of the alternating stack (30, 60). Each of the resistive memory material layer 88L, the tunneling dielectric layer 86L, and the second conductivity type semiconductor layer 85 can be the same as in the fourth exemplary three-dimensional memory device of FIG. 12B.

The resistive memory material layer 88L can be located over the sidewalls of the alternating stack (30, 60), and can be formed as a planar layer extending over an entirety of the sidewalls of the alternating stack (30, 60) and contacting the entirety of the sidewalls of the alternating stack (30, 60) and having a uniform thickness throughout. Each of the tunneling dielectric layer 86L and the second conductivity type semiconductor layer 85 can be formed as a planar layer extending over an entirety of the sidewalls of the alternating stack (30, 60) and having a uniform thickness throughout.

The second conductivity type semiconductor layer 85 has a doping of the second conductivity type, which may be p-type or n-type. In one embodiment, the second conductivity type can be p-type. In one embodiment, the atomic concentration of the dopants of the second conductivity type can be less than $5.0 \times 10^{19}/cm^3$, although greater atomic concentrations can also be employed.

As shown in FIG. 13C, a first conductivity type semiconductor layer 83 having a doping of the opposite conductivity type can be formed on the second conductivity type semiconductor layer 85 to provide a continuous p-n junction. The direction of the thickness of the first conductivity type semiconductor layer 83 is herein referred to as a second direction. The first conductivity type semiconductor layer 83 extends at least along the first direction, and may extend along a third direction that is perpendicular to the first direction and to the second direction. The extent of the first conductivity type semiconductor layer 83 as deposited may have a greater extent along the first direction than along the second and third directions, thereby rendering the first conductivity type semiconductor layer 83 to be an electrically conductive line 90 (e.g., line 90 is both a bit line and the n+ layer of the diode). Alternatively or additionally, the first conductivity type semiconductor layer 83 can be subsequently patterned such that each remaining portion of the first conductivity type semiconductor layer 83 extends farther along the first direction than along the second and third directions, thereby rendering each remaining portion of the first conductivity type semiconductor layer 83 to be an electrically conductive line 90. Thus, the electrically conductive line 90 can be formed by depositing a first conductivity type semiconductor layer 83 having a doping of a first conductivity type over the sidewalls of the alternating stack (30, 60).

The layer stack 80 employed in the fifth exemplary three-dimensional memory device can be the same as a modification of the exemplary structure of FIG. 6B in which the first conductivity type semiconductor layer 83 functions as the electrically conductive line 90. Thus, a structure (83/90) that is both an electrically conductive line 90 and a first conductivity type semiconductor layer 83 extends along the first direction over the sidewalls of the alternating stack (33, 60). The second conductivity type semiconductor layer 85 is interposed between the electrically conductive line 90 and the sidewalls of the alternating stack (30, 60). The electrically conductive line 90 is formed on the second conductivity type semiconductor layer 85.

Each of the exemplary three-dimensional memory devices described above include an alternating stack of insulating layers 60 and conductive material layers 30 that alternate along a first direction; an electrically conductive line 90 that extend along the first direction and separated from the alternating stack (30, 60) along a second direction; and a plurality of memory elements (85, 86, 88 and optionally 83 if element 83 is separate from the layers 30 or 90) located at each level of the conductive material layers 30. Each memory element (83, 85, 86, 88) includes a steering element (83, 85); a tunneling dielectric element 86 contacting the steering element, wherein a predominant mode of electrical current conduction through the tunneling dielectric element 86 is charge carrier tunneling; and a resistive memory element 88 contacting the tunneling dielectric element 86 and including a dielectric material having multiple states providing different electrical resistance depending on an electrical bias that is previously applied thereto. The steering element (83, 85) can comprise a diode. The tunneling dielectric element 86 can comprise a dielectric material having a dielectric constant of at least 7.0, and can have a thickness in a range from 0.6 nm to 4 nm.

In some embodiments, the resistive memory elements 88 can include discrete portions of a dielectric metal oxide disposed between neighboring pairs of an insulating layer 60 and an electrically conductive layer 30, and each resistive memory element 88 can include a pair of parallel portions (e.g., horizontal portions that extend perpendicular to the plane of the p-n junction(s)) adjoined by a connecting portion (e.g., a vertical portion that extends parallel to the plane of the p-n junction(s)), and can surround a respective conductive material layer 30 on three sides as illustrated in FIGS. 9D, 10D and 11D. In one embodiment, the tunneling dielectric elements 86 can include discrete portions of a dielectric material having a dielectric constant of at least 7.0, and each tunneling dielectric element 86 can include a pair of parallel (e.g., horizontal) portions adjoined by a connecting (e.g., vertical) portion, and surrounds a respective resistive memory element 88 on three sides as illustrated in FIGS. 9D and 11D. In one embodiment, the tunneling dielectric elements 86 can include discrete portions (e.g., vertical strips or segments) of a dielectric material having a dielectric constant of at least 7.0, and each resistive memory element 86 can be in physical contact with at least one of the insulating layers 60 as illustrated in FIG. 10D.

In some embodiments, the steering elements (83, 85) in the plurality of memory elements can include portions of a single p-n junction within a layer stack 80 including a p-doped semiconductor layer (e.g., one of the first and second conductivity type semiconductor layers (83, 85)) and an n-doped semiconductor layer (e.g., another of the first and second conductivity type semiconductor layers (83, 85)) such that the portions of the layer stack 80 are spaced from one another along the first direction as illustrated in FIGS. 9D, 10D, and 13C.

In some embodiments, the steering elements (83, 85) in the plurality of memory elements can include a plurality of disjoined p-n junctions located at each level of the conductive material layers 30 and spaced from one another along the first direction as illustrated in FIG. 11D (vertical segments or strips 85) and FIG. 12C (horizontal segments 83).

In some embodiments, the electrically conductive line 90 comprises a doped semiconductor layer having a doping of a first conductivity type, and each steering element in the plurality of memory elements comprise a diode including a portion of the doped semiconductor layer and a plurality of doped semiconductor portions (e.g., portions of the second conductivity type semiconductor layer 85) located at each level of the conductive material layers 30 and having a doping of a second conductivity type that is the opposite of the first conductivity type as illustrated in FIGS. 9D, 10D, 11D and 13C.

In some embodiments, the resistive memory elements 88 in the plurality of memory elements comprise portions of a continuous vertical dielectric material layer extending along the first direction such that the portions of the dielectric material layer are spaced from one another along the first direction as illustrated in FIGS. 12C and 13C. In some embodiments, the tunneling dielectric elements 86 in the plurality of memory elements comprise portions of a continuous vertical tunneling dielectric layer extending along the first direction such that the portions of the tunneling dielectric layer are spaced along the first direction as illustrated in FIGS. 12C and 13C.

In some embodiments, the conductive material layers 30 (e.g., word lines) may comprise horizontally extending doped semiconductor layers 83 having a doping of a first conductivity type, and a doped semiconductor line (as embodied as a second conductivity type semiconductor layer 85) extending along the first (vertical) direction and having a doping of a second conductivity type (which is the opposite of the first conductivity type) contacts each of the insulating layers 60 and conductive material layers 30 as illustrated in FIG. 12C.

Endurance of barrier modulated cell (BMC) ReRAM devices suffers from fast degradation of low resistance state (LRS), in either single pulse cycling or incremental step pulse programming (ISPP) cycling. The shift of LRS towards high resistance state (HRS) closes the resistance window down, and limits the cell endurance in the range of thousand cycles. The 1 k cycle performance is far too low for storage class memory (SCM) applications.

Figure 14A:
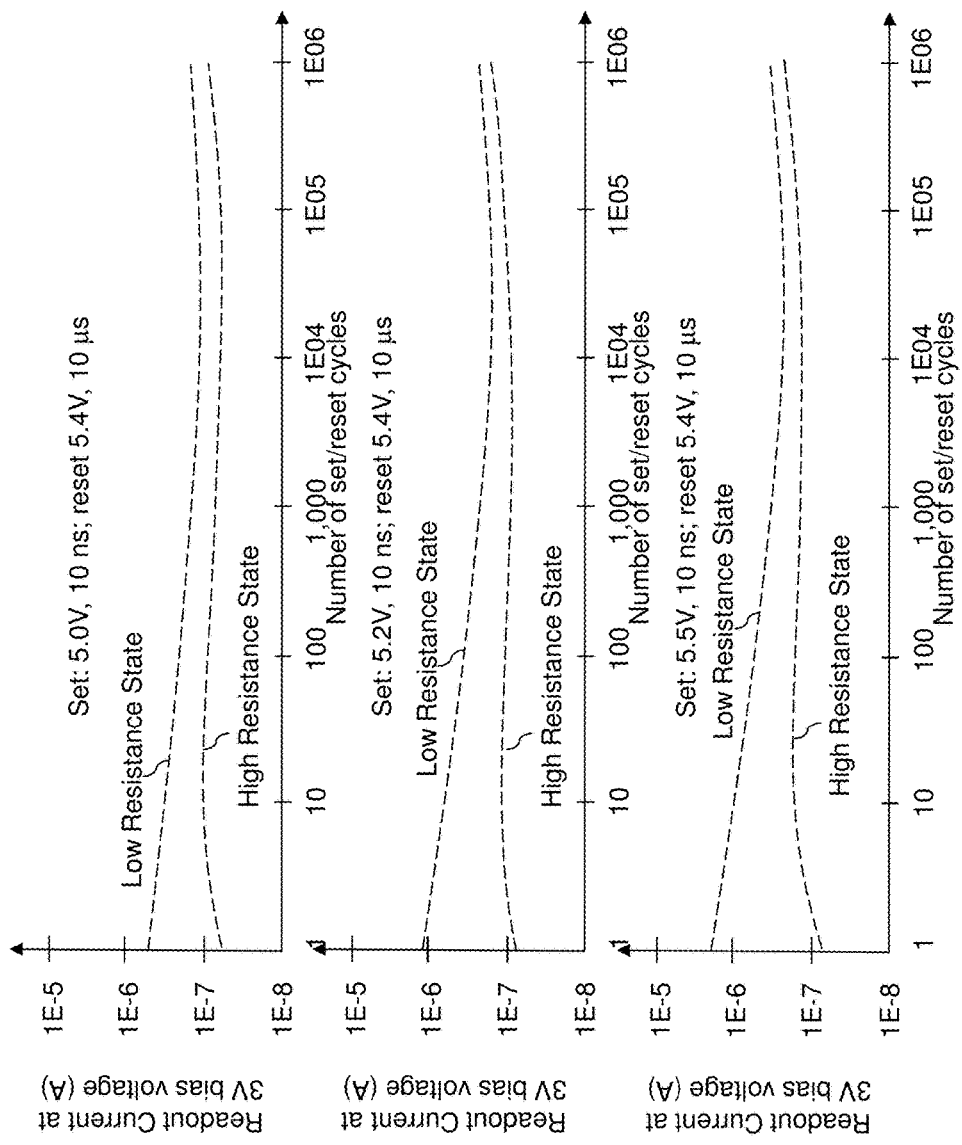
FIG. 14A is set of graphs illustrating change of electrical current through a prior art barrier modulated cell (BMC) resistive random access memory (ReRAM) device during single pulse blind cycling with different SET pulse voltages.

FIG. 14A is set of graphs illustrating change of electrical current through a prior art barrier modulated cell (BMC) resistive random access memory (ReRAM) device during single pulse blind cycling with different SET pulse voltages. RESET time is fixed at 10 microseconds, and the reset voltage is fixed at 5.4 V. The SET/RESET pulses in BMC are very asymmetric. During the cycling, the low resistance state (LRS) typically degrades towards high resistance state (HRS), triggering a SET failure.

Figure 14B:
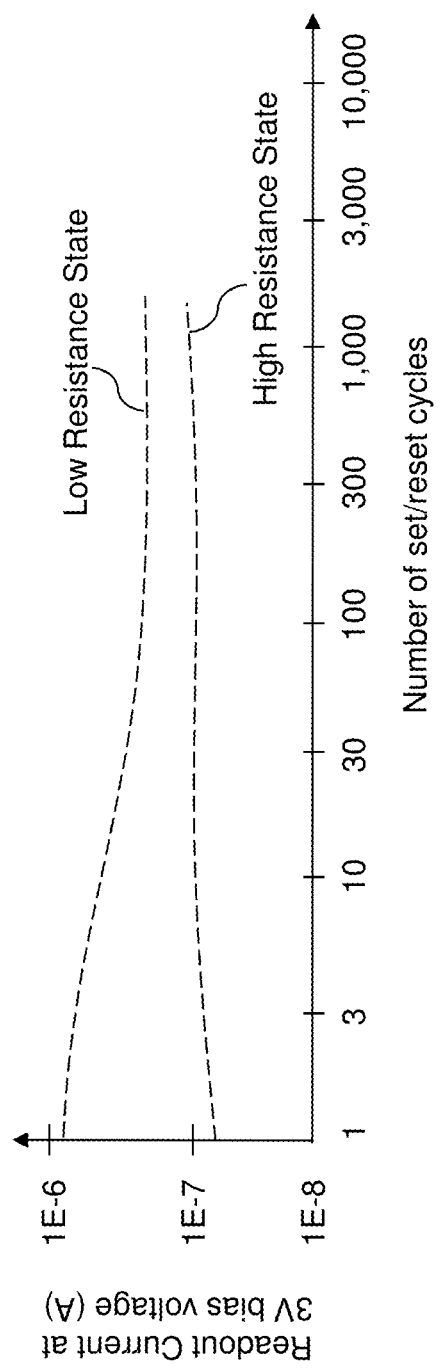
FIG. 14B is a graph illustrating change of electrical current through a prior art BMC ReRAM during an incremental step pulse programming (ISPP) cycling.

FIG. 14B is a graph illustrating change of electrical current through a prior art BMC ReRAM during an incremental step pulse programming (ISPP) cycling of a prior art BMC cell. A range from 4.5 V to 5.5 V is employed for the set voltage, and the duration of the pulse during each set operation is 3 microseconds. A range from 5.5 V to 6.5 V is employed for the reset voltage, and the duration of the pulse during each reset operation is 10 microseconds. The low resistance state (LRS) degrades towards the high resistant state (HRS), triggering a SET failure.

Referring to FIG. 15A, operation of a prior art BMC ReRAM during a reset switching process is illustrated. The switching mechanism in BMC stack is generally understood as oxygen interstitials Oi generation in the barrier oxide ($SiO_2$) at the amorphous silicon (a-Si)/$TiO_2$ interface during RESET, and drift into defect rich $TiO_x$ where they cause a re-oxidation of the TiOx near the interface. This re-oxidation decreases the conductivity of the TiOx layer and hence increases the resistance of the BMC-stack and the cell is switched into an HRS state.

Referring to FIG. 15B, operation of a prior art BMC ReRAM during a set switching process is illustrated. During the SET operation, opposite voltage is applied across the stack, and Ti-O bonds are supposed to be broken down to generate Oi and Vo pair. Oi will drift back to the a-Si/$TiO_x$ interface along the electric field.

In a first embodiment of the present disclosure, and without wishing to be bound by a particular theory, the inventor of the present disclosure recognized that the LRS degradation may be caused by oxygen loss to the semiconductor (a-Si). Oi Vo pairs can be generated during the LRS process at high voltages in the barrier oxide. The oxygen (Oi) are now forced by the electric field towards the a-Si interface where the oxygen can react with the a-Si to form fairly conductive SiOx. Eventually too much oxygen is lost from the barrier oxide and a catastrophic breakdown occurs.

The area-dependent resistive switching cell of the first embodiment of the present disclosure provides advantages over prior art area dependent, conductive metal oxide based resistive switching cells, which depend on the migration of oxygen vacancies. Dependency on migration of oxygen vacancies causes various issues including retention, endurance, and RTN issues.

The area-dependent resistive switching cell of the present disclosure employs a conductive metal oxide (such as $TiO_x$) with low ionicity, free electrons in the pristine state, and mobile oxygen ions. In one embodiment, the conductive metal oxide of the area-dependent resistive switching cell is sandwiched between a first electrode including a low work function metal and a second electrode including a high work function metal. In another embodiment, the conductive metal oxide of the area-dependent resistive switching cell is sandwiched between a low work function electrode and a thin barrier oxide material (which may include another metal oxide material).

Figure 17:
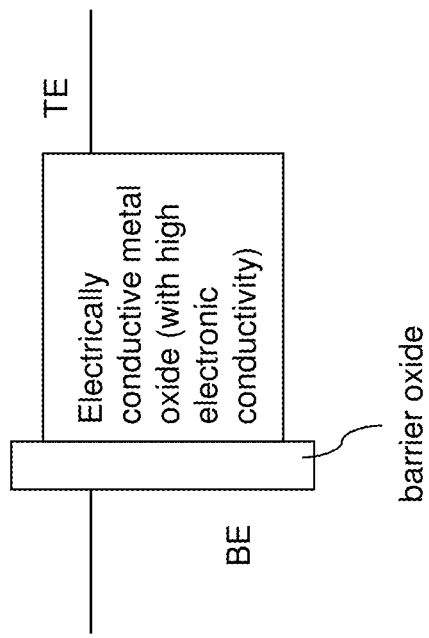
FIGS. 16 and 17 are schematic illustrations of an embodiment device.
Figure 16:
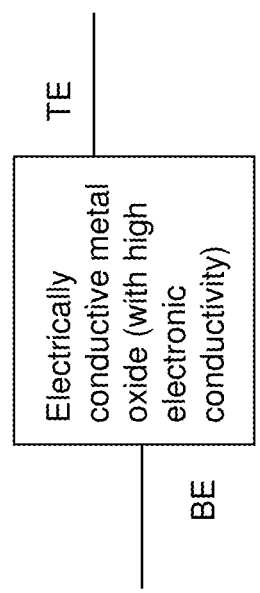

FIG. 16 illustrates a schematic electronic band structure of a conductive metal oxide material portion 110 with a first electrode 130 (e.g., bottom electrode, BE) including a low work function metal, and a second electrode 190 (e.g., top electrode, TE) including a higher work function metal than the bottom electrode. FIG. 17 illustrates a schematic electronic band structure of a conductive metal oxide material portion 110 and a thin barrier metal oxide layer 120. The barrier metal oxide layer 120 may be located between the conductive metal oxide layer and either the first or the second electrode. In the case the barrier metal oxide layer (e.g., electron barrier) is present, both electrodes may have the same (e.g., high or low) work function. While a bottom electrode (BE) and a top electrode (TE) are illustrated in FIGS. 16 and 17 it should be noted that the two electrodes do not have to be located on top and bottom of the metal oxide material portion. For example, the two electrodes may be located on opposite lateral sides of the conductive metal oxide material portion in a vertical bit line (VBL) configuration.

The resistive switching cell of the present disclosure can be switched between at least 2 different resistance states by oxygen-ion migration, which is caused by a change in electron density. As the change in electron density (initiated by applying a voltage to the top and bottom electrodes (TE, BE)) is uniform across the surface, the migration of oxygen ions is uniform, and the effect scales with the area of the cell.

Figure 18A:
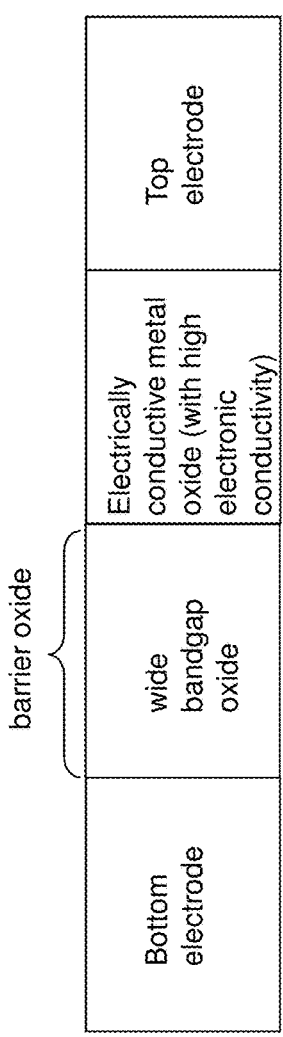
FIGS. 18A-18C illustrate various configurations for the device of FIG. 17.
Figure 18B:
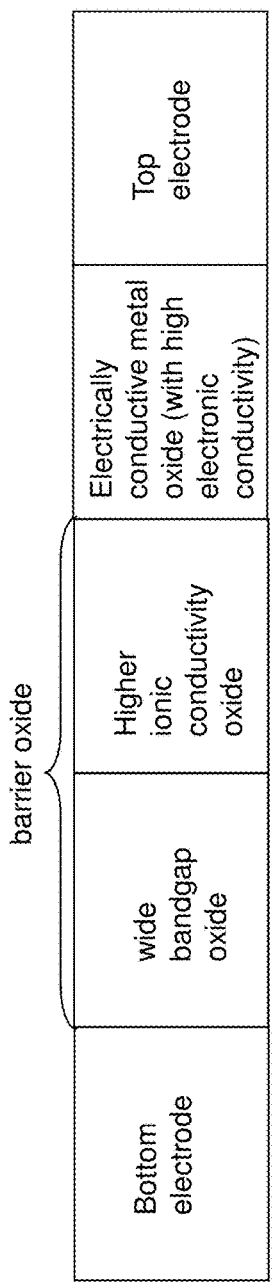
Figure 18C:
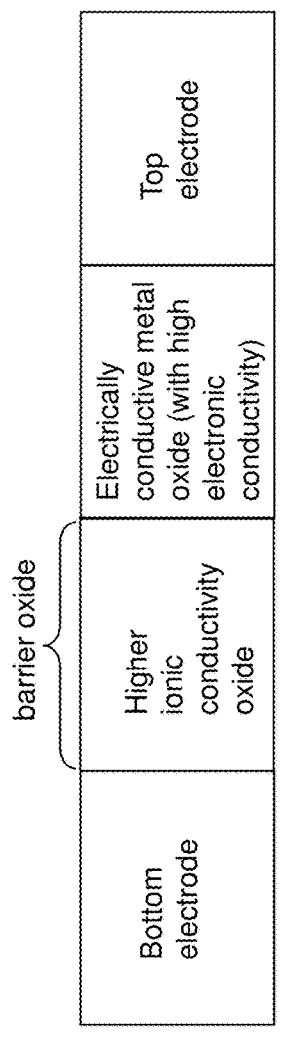

FIGS. 18A-18C illustrate various configurations for the device of FIG. 17. The barrier oxide layer 120 can be either a reaction layer (caused by a surface reaction with the bottom electrode material), or an intentionally deposited metal oxide layer having a thickness in a range from 1 nm to 2 nm. For example, the bottom electrode material can include TiN, Si, or Ge, and the barrier oxide layer can include $TiO_2$, $TiO_{2-d}N_e$ (wherein d is a positive number less than 0.5 and e is a positive number less than 0.25), $SiO_2$, or $GeO_2$ formed by oxidation of a surface portion of the bottom electrode material. Alternatively, a dielectric oxide layer such as a layer of $Al_2O_3$, $SiO_2$ or $GeO_2$ can be deposited to form the barrier oxide layer. The barrier oxide layer can include a single oxide layer, or a combination of two oxide layers having different compositions. For example, the barrier oxide 120 can include an oxide layer 120A having a wider bandgap than a bandgap of the electrically conductive metal oxide material portion (e.g., a bandgap wider than the bandgap of titanium oxide) and/or an oxide layer 120B having a higher ionic conductivity than the ionic conductivity of the electrically conductive metal oxide material portion 110 (e.g., a higher than ionic conductivity of titanium oxide). If both barrier layers 120A and 120B are present as shown in FIG. 18B, then the wider bandgap and the higher ionic conductivity layers may be arranged in any order with either layer being located next to the electrically conductive metal oxide material portion. In another embodiment, if the bandgap of the higher ionic conductivity oxide layer is sufficiently wide to act as a barrier, then the wider bandgap oxide layer may be omitted.

The wider bandgap oxide layer may comprise a wide bandgap (e.g., non-transition-metal) oxide layer, such as $Al_2O_3$, $SiO_2$, or $GeO_2$, and having a thickness in a range from 0.5 nm to 1 nm.

The higher ionic conductivity oxide layer may comprise any suitable high ionic conductivity oxide, such as a stabilized zirconia, a doped ceria, a doped aluminate, a pervoskite material or a doped gallate material. This layer may have a thickness in a range from 1 nm to 2 nm. An example of a stabilized zirconia includes yttria stabilized zirconia (also known as yttrium stabilized zirconia or "YSZ"). An example of a doped ceria includes gadolinia doped ceria (also known as gadolinium doped ceria or "GDC"). An example of a doped aluminate includes calcium aluminate ("CaAlO", e.g., $nCa \cdot Al_2O_3$, where n=1, 3, ½, ⅙ or ¹²⁄₇). An example of a perovskite material includes praseodymium calcium manganate ("PCMO", e.g., $Pr_{1-x}Ca_xMn_1O_3$ where x ranges between zero and one). An example of a doped gallate includes strontium and magnesium doped gallate ("LSGM", e.g., $La_2O_3/GaO/MgO/SrO$ or $La_{1-y}Sr_yGa_{1-z}Mg_zO_3$ where y and z each independently range between zero and one) which has also has a pervoskite structure.

The conductive metal oxide material portion can include a highly conductive slightly sub-stoichiometric oxide ($TiO_{2-x}$, $SrTiO_{3-x}$, $NbO_{2-x}$, $Nb:SrTiO_{3-x}$) with a high concentration of free electrons in thermodynamic equilibrium n0 in a range from $1.0 \times 10^{20}/cm^3$ to $1.0 \times 10^{21}/cm^3$, for example at room temperature (e.g., 25 degrees Celsius) Each value of x can be independently selected from a range from 0 to 1, such as greater than zero to 1 (i.e., to form a sub-stoichiometric, oxygen deficient metal oxide).

When an electric field is applied with a positive bias at the top electrode, the Schottky-barrier embodied either by the high work function electrode or the thin oxide represents a barrier for electrons. This causes a reduction of the electron density within the conductive metal oxide. The reduction of the electron density permits oxygen ions to migrate into the conductive metal oxide. This increases the barrier width (not height). When this process is finished, the cell is in the OFF-state.

Figure 19A:
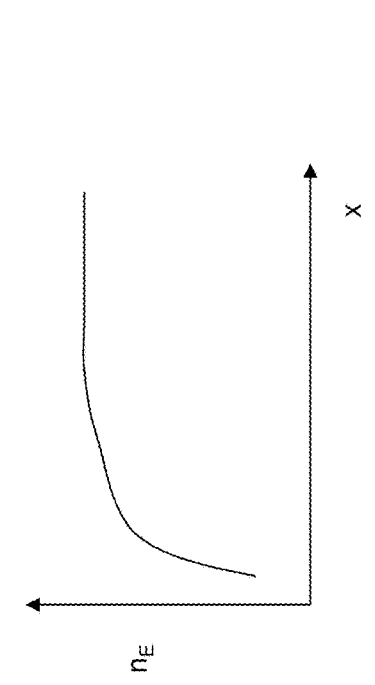
FIGS. 19A, 19B, 19C and 19D are schematic illustrations of operating conditions of the device according to an embodiment of the present disclosure.

FIGS. 19A-D illustrate a RESET operation into the OFF-state. FIG. 19A illustrates the electronic structure of the cell. The conductive metal oxide contains mobile electrons. The barrier oxide is in thermodynamic equilibrium with the conductive metal oxide after deposition Referring to FIG. 19B, as a bias is applied, the electrons in the conductive metal oxide are depleted near the barrier oxide interface as the Schottky barrier at the bottom electrode (BE) hems the flow of electrons through the barrier oxide.

Figure 19B:
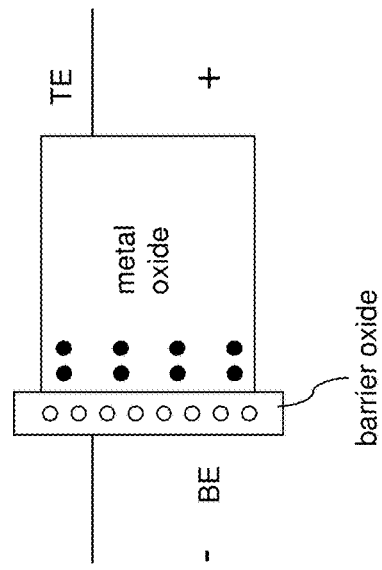
Figure 19C:
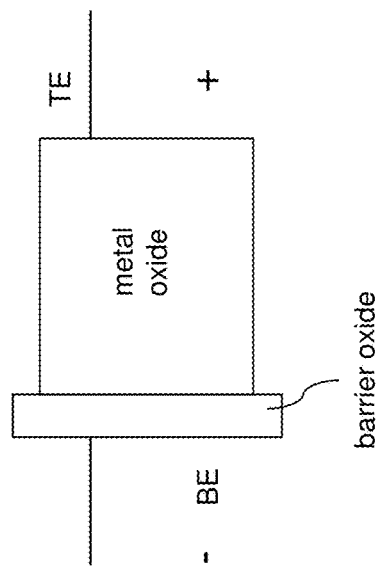

Referring to FIG. 19C, the field in the barrier oxide allows Frenkel pairs to emerge (Oi+Vo). The oxygen ions can migrate towards the conductive oxide and due to the electron density reduction allows the oxygen ions to migrate as a consequence of the high electric field at the interface between the barrier oxide layer and the conductive metal oxide portion into the metal oxide. The oxygen ions can fill vacancies in the conductive metal oxide or sit interstitially.

Figure 19D:
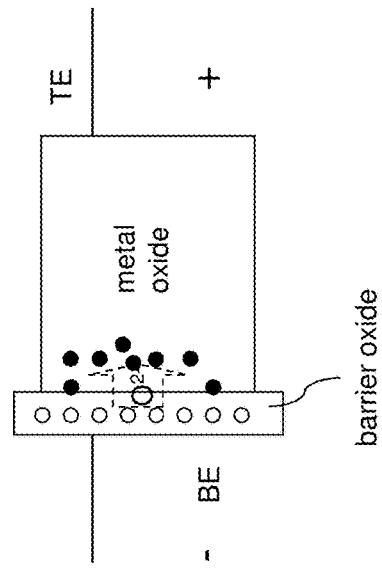

Referring to FIG. 19D, the oxygen vacancies in the barrier oxide remain while the oxygen ions oxidize the conductive metal oxide.

Overall, the change in electronic structure of the substoichiometric but thin barrier oxide is insignificant. However, the oxidation of the conductive metal oxide increases the potential drop across the barrier-metal-oxide interface which represents a higher resistance state. This mechanism has self-limiting characteristics. As the electric field increases, the oxidation increases accordingly, and therefore, the voltage drop across the interface can be accommodated.

To set the cell back into the ON-state, the polarity of the applied voltage is reversed. This causes the oxygen ions to migrate into the opposite direction. This reduces the barrier width. Because of the electronic structure the electron transport the "SET-polarity" is not strongly influenced by the increase in barrier width. Therefore, the IV curve exhibits no or little hysteresis in the SET-direction. The process is described in more detail in FIGS. 20A and 20B, which illustrate a SET operation into the ON-state.

Figure 20A:
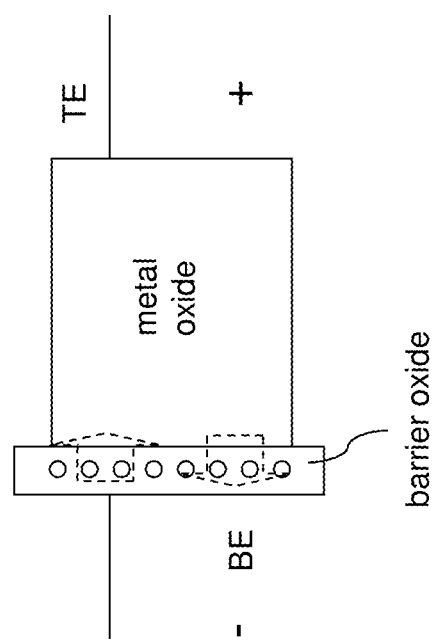
FIGS. 20A-20B are schematic illustrations of operating conditions of the device according to an embodiment of the present disclosure.

Referring to FIG. 20A, the electronic structure of the cell in the SET-polarity allows for relatively easy electron transport as the barrier height of the conductive metal oxide/barrier oxide interface is small. The drop of the field across the barrier oxide causes the electron density to decrease near the conductive metal oxide interface a little bit. This enables oxygen ions to migrate back to the barrier oxide. As this process doesn't change the transport properties, this process depicts little or no hysteresis. Because the change in electron density is small for the ON-polarity the system can only be switched back into the state of its thermodynamic equilibrium which is the ON-state.

Figure 20B:
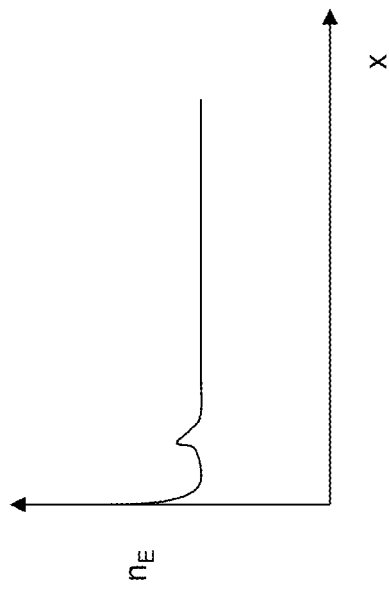

FIG. 20B illustrates electron density distribution during the SET-polarization.

Overall, because the effect is distributed over the entire area, the stochasticity of this mechanism appears to be very small and yields small distributions.

Thus, as illustrated in FIGS. 19A through 20B, the method of operating a memory device having a resistive memory element comprising a conductive metal oxide located between a first electrode and a second electrode includes redistributing electron density to set and reset the device. The method may also include restructuring the metal oxide to set and reset the device.

Redistributing the electron density may include decreasing the electron density at an interface between the conductive metal oxide and an electron barrier (e.g. the barrier metal oxide layer) to reset the device into an OFF state, and increasing the electron density at the interface between the conductive metal oxide and the electron barrier to set the device into an ON state. As shown in FIGS. 19B and 20B, the electron density at the interface between the conductive metal oxide and the electron barrier is lower than the electron density in a middle of the conductive metal oxide in the OFF state (e.g., at least 10% lower, such as 20-60% lower), and the electron density at the interface between the conductive metal oxide and the electron barrier is substantially the same as the electron density in the middle of the conductive metal oxide in the ON state (i.e., exactly the same or less than 10% different).

The resistive memory cell of FIGS. 16-20B can be implemented in the MIM cross point (i.e., cross bar) array or VBL configurations. The resistive memory cell of FIGS. 16-20B can be employed in conjunction with a steering element, such as a transistor or diode. Exemplary VBL integration schemes are described above with respect to FIGS. 9A-9D, 10A-10D, 11A-11C, 12A-12C and 13A-13C.

Exemplary MIM cross point array configurations are described in U.S. Pat. No. 7,800,934 to Kumar et al., the entire contents of which are incorporated herein by reference.

The resistive memory cells of FIGS. 16-20B have the advantage of very low stochasticity and area scaling. The mobile electrons in the oxide work as a "leveling-agent" that prevents the formation of charge percolations. This provides a continuous operation of the cell in the area-scaling mode.

The resistive memory cells of FIGS. 16-20B exhibit very little stochasticity. Therefore the statistic distributions are very low, which makes ReRAM devices feasible. The currents are scalable depending on the barrier oxide thickness. The voltages are scalable as well depending on the barrier height and electron density in the conductive metal oxide. Preferably, the conductive metal oxide is non-filamentary and does not form conductive filaments in the ON state.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising at least one memory cell, each of the at least one memory cell comprises a resistive memory element comprising a conductive metal oxide located between a first electrode and a second electrode, wherein the conductive metal oxide has a concentration of free electrons in thermodynamic equilibrium in a range from $1.0 \times 10^{20}/cm^3$ to $1.0 \times 10^{21}/cm^3$.

2. The memory device of claim 1, further comprising an oxide barrier layer located between the conductive metal oxide and the second electrode.

3. The memory device of claim 2, wherein the oxide barrier layer comprises at least one of an oxide material having a wider bandgap than a bandgap of the conductive metal oxide and an oxide material having a higher ionic conductivity than an ionic conductivity of the conductive metal oxide.

4. The memory device of claim 3, wherein the oxide barrier layer comprises the oxide material having the wider bandgap than the bandgap of the conductive metal oxide.

5. The memory device of claim 3, wherein the oxide barrier layer comprises the oxide material having the higher ionic conductivity than the ionic conductivity of the conductive metal oxide.

6. The memory device of claim 3, wherein the oxide barrier comprises a stack of the oxide material having the wider bandgap than the bandgap of the conductive metal oxide and the oxide material having the higher ionic conductivity than the ionic conductivity of the conductive metal oxide.

7. The memory device of claim 2, wherein the oxide barrier layer comprises a material selected from $TiO_2$, $TiO_{2-d}N_e$ wherein d is a positive number less than 0.5 and e is a positive number less than 0.25, $SiO_2$, $GeO_2$, and $Al_2O_3$.

8. The memory device of claim 2, wherein the oxide barrier comprises a material selected from a stabilized zirconia, a doped ceria, a doped aluminate, a pervoskite material and a doped gallate material.

9. The memory device of claim 8, wherein the oxide barrier further comprises a material selected from $TiO_2$, $TiO_{2-d}N_e$ wherein d is a positive number less than 0.5 and e is a positive number less than 0.25, $SiO_2$, $GeO_2$, and $Al_2O_3$.

10. The memory device of claim 2, wherein the oxide barrier layer has a thickness in a range from 1 nm to 2 nm.

11. The memory device of claim 2, wherein the conductive metal oxide portion is selected from a group consisting of $TiO_{2-x}$, $SrTiO_{3-x}$, $NbO_{2-x}$, $Nb:SrTiO_{3-x}$, wherein each value of x is independently selected from a range from greater than zero to 1.

12. The memory device of claim 2, wherein the conductive metal oxide comprises $TiO_2$.

13. The memory device of claim 1, wherein the at least one memory cell further comprises a steering element and wherein the memory device is in a configuration selected from a cross point array configuration and a vertical bit line configuration.

14. The memory device of claim 1, wherein the first electrode contacts one sidewall of the conductive metal oxide portion and the second electrode contacts another sidewall of the conductive metal oxide portion.

15. A method of operating a memory device comprising a resistive memory element comprising a conductive metal oxide located between a first electrode and a second electrode, the method comprising redistributing electron density to set and reset the device;
wherein the conductive metal oxide has a concentration of free electrons in thermodynamic equilibrium in a range from $1.0 \times 10^{20}/cm^3$ to $1.0 \times 10^{21}/cm^3$.

16. The method of claim 15, further comprising restructuring the metal oxide to set and reset the device.

17. The method of claim 15, wherein redistributing the electron density comprises decreasing the electron density at an interface between the conductive metal oxide and an electron barrier to reset the device into an off state, and increasing the electron density at the interface between the conductive metal oxide and the electron barrier to set the device into an on state.

18. A method of operating a memory device comprising a resistive memory element comprising a conductive metal oxide located between a first electrode and a second electrode, the method comprising redistributing electron density to set and reset the device;
wherein redistributing the electron density comprises decreasing the electron density at an interface between the conductive metal oxide and an electron barrier to reset the device into an off state, and increasing the electron density at the interface between the conductive metal oxide and the electron barrier to set the device into an on state; and
wherein the electron density at the interface between the conductive metal oxide and the electron barrier is lower than the electron density in a middle of the conductive metal oxide in the off state, and the electron density at the interface between the conductive metal oxide and the electron barrier is substantially the same as the electron density in the middle of the conductive metal oxide in the on state.

19. The method of claim 18, wherein the conductive metal oxide has a concentration of free electrons in thermodynamic equilibrium in a range from $1.0 \times 10^{20}/cm^3$ to $1.0 \times 10^{21}/cm^3$.

20. A method of operating a memory device comprising a resistive memory element comprising a conductive metal oxide located between a first electrode and a second electrode, the method comprising redistributing electron density to set and reset the device; and
further comprising forming an oxide barrier layer located between the conductive metal oxide and the second electrode, wherein the oxide barrier layer comprises at least one of an oxide material having a wider bandgap than a bandgap of the conductive metal oxide and an oxide material having a higher ionic conductivity than an ionic conductivity of the conductive metal oxide.

* * * * *